United States Patent
Chou et al.

(10) Patent No.: US 11,276,716 B2
(45) Date of Patent: Mar. 15, 2022

(54) IMAGE SENSOR WITH IMPROVED NEAR-INFRARED (NIR) RADIATION PHASE-DETECTION AUTOFOCUS (PDAF) PERFORMANCE

(71) Applicant: Taiwan Semiconductor Manufacturing Co., Ltd., Hsin-Chu (TW)

(72) Inventors: Keng-Yu Chou, Kaohsiung (TW); Chun-Hao Chuang, Hsinchu (TW); Kazuaki Hashimoto, Zhubei (TW); Wei-Chieh Chiang, Yuanlin Township (TW); Cheng Yu Huang, Hsinchu (TW); Wen-Hau Wu, New Taipei (TW); Chih-Kung Chang, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/019,502

(22) Filed: Sep. 14, 2020

(65) Prior Publication Data
US 2021/0183922 A1    Jun. 17, 2021

Related U.S. Application Data

(60) Provisional application No. 62/948,920, filed on Dec. 17, 2019.

(51) Int. Cl.
*H01L 27/146* (2006.01)
*G01J 1/02* (2006.01)
*G01J 1/44* (2006.01)

(52) U.S. Cl.
CPC ...... *H01L 27/14603* (2013.01); *G01J 1/0271* (2013.01); *G01J 1/44* (2013.01);
(Continued)

(58) Field of Classification Search
CPC ......... H01L 27/14603; H01L 27/14605; H01L 27/14623; H01L 27/1462; H01L 27/14625;
(Continued)

(56) References Cited

U.S. PATENT DOCUMENTS 9,698,191 B2    7/2017    Hseih et al.
9,883,128 B2    1/2018    Banachowicz et al.
(Continued)

OTHER PUBLICATIONS

U.S. Appl. No. 17/140,346, filed Jan. 4, 2021.

*Primary Examiner* — John R Lee
(74) *Attorney, Agent, or Firm* — Eschweiler & Potashnik, LLC

(57) ABSTRACT

Various embodiments of the present disclosure are directed towards an integrated chip (IC). The IC comprises a first phase detection autofocus (PDAF) photodetector and a second PDAF photodetector in a substrate. A first electromagnetic radiation (EMR) diffuser is disposed along a back-side of the substrate and within a perimeter of the first PDAF photodetector. The first EMR diffuser is spaced a first distance from a first side of the first PDAF photodetector and a second distance less than the first distance from a second side of the first PDAF photodetector. A second EMR diffuser is disposed along the back-side of the substrate and within a perimeter of the second PDAF photodetector. The second EMR diffuser is spaced a third distance from a first side of the second PDAF photodetector and a fourth distance less than the third distance from a second side of the second PDAF photodetector.

20 Claims, 22 Drawing Sheets

(52) U.S. Cl.
CPC .... *H01L 27/1464* (2013.01); *H01L 27/14623* (2013.01); *H01L 27/14627* (2013.01); *H01L 27/14649* (2013.01); *H01L 27/14685* (2013.01); *H01L 27/14689* (2013.01); *G01J 2001/446* (2013.01)

(58) Field of Classification Search
CPC .......... H01L 27/14627; H01L 27/1464; H01L 27/14643; H01L 27/14649; H01L 27/14685; H01L 27/14689; G01J 1/0271; G01J 1/44; G01J 2001/446
See application file for complete search history.

(56) References Cited

U.S. PATENT DOCUMENTS

| | | | |
|---|---|---|---|
| 9,893,111 B2* | 2/2018 | Chou | H04N 5/37457 |
| 9,905,605 B2* | 2/2018 | Hsu | H01L 27/14627 |
| 10,002,899 B2* | 6/2018 | Chou | H01L 27/14605 |
| 10,367,023 B1 | 7/2019 | Chou et al. | |
| 10,397,465 B2* | 8/2019 | Galor Gluskin | H04N 5/36961 |
| 2018/0367747 A1* | 12/2018 | Mo | H04N 5/374 |
| 2019/0096930 A1* | 3/2019 | Chuang | H01L 27/1463 |
| 2019/0096945 A1* | 3/2019 | Lu | H01L 27/14645 |
| 2020/0098801 A1* | 3/2020 | Chou | H01L 27/14625 |
| 2020/0098812 A1 | 3/2020 | Lee et al. | |
| 2020/0219913 A1* | 7/2020 | Lee | H01L 27/1463 |
| 2020/0273892 A1 | 8/2020 | Perkins et al. | |
| 2021/0183922 A1* | 6/2021 | Chou | H01L 27/1464 |
| 2021/0265414 A1* | 8/2021 | Chiang | H01L 27/14687 |

* cited by examiner

IMAGE SENSOR WITH IMPROVED NEAR-INFRARED (NIR) RADIATION PHASE-DETECTION AUTOFOCUS (PDAF) PERFORMANCE

REFERENCE TO RELATED APPLICATION

This application claims the benefit of U.S. Provisional Application No. 62/948,920, filed on Dec. 17, 2019, the contents of which are hereby incorporated by reference in their entirety.

BACKGROUND

Integrated chips (ICs) with image sensors are used in a wide range of modern electronic devices (e.g., digital cameras, optical imaging devices, etc.). In recent years, complementary metal-oxide semiconductor (CMOS) image sensors have begun to see widespread use, largely replacing charge-coupled device (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
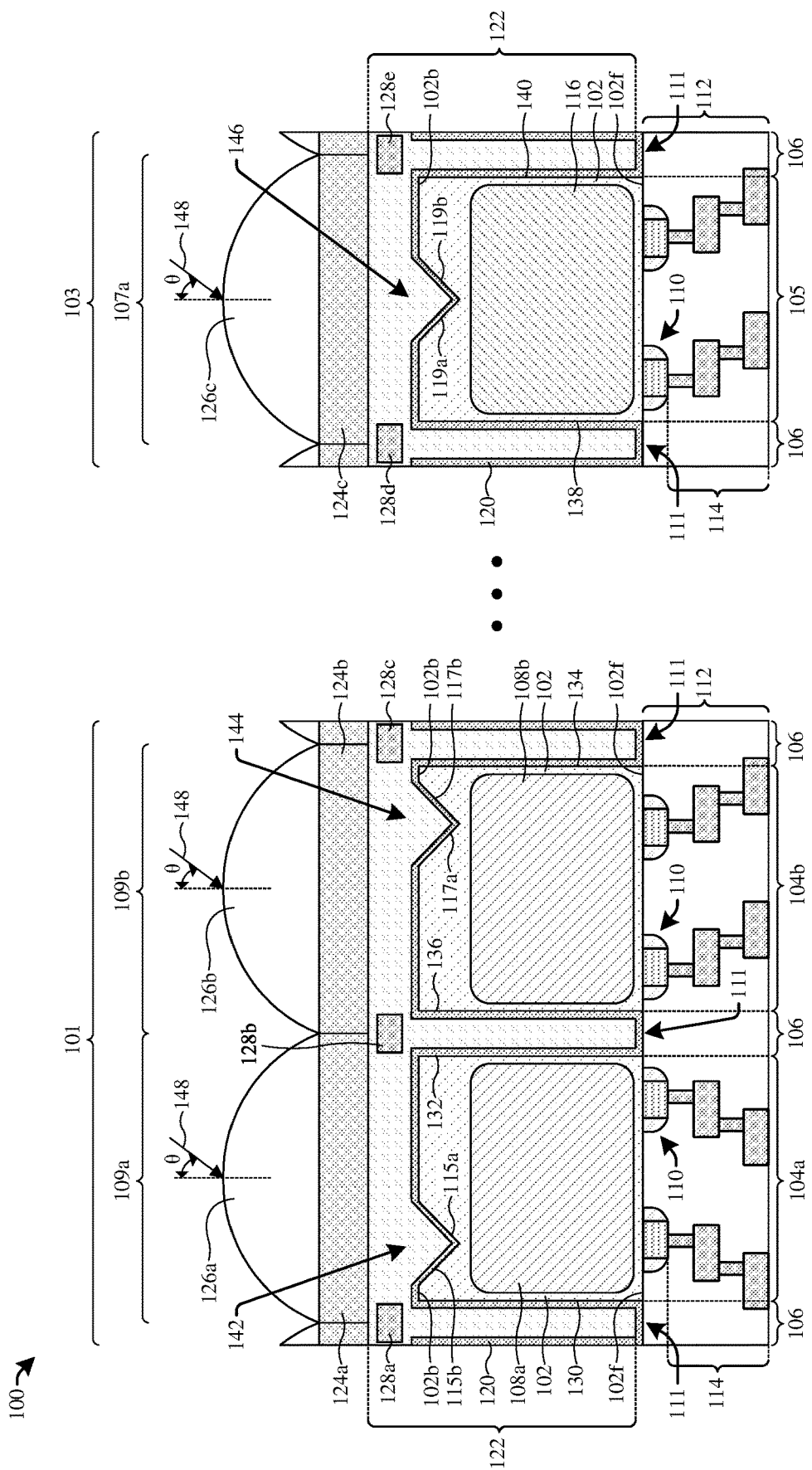
FIG. 1 illustrates a cross-sectional view of some embodiments of an image sensor with improved near-infrared (NIR) radiation phase detection autofocus (PDAF) performance.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many electronic devices (e.g., cameras, cellular telephones, computers, etc.) include an image sensor (e.g., an image sensor integrated chip (IC)) for capturing images. One example of such an image sensor is a complementary metal-oxide semiconductor image sensor (CIS) with phase detection autofocus (PDAF). While many CIS with PDAF have been optimized for visible light, there is a growing demand for CIS with PDAF that detect non-visible electromagnetic radiation (EMR), especially near-infrared (NIR) radiation, for use in various applications, such as, security, personal authentication, and range finding applications. To make a CIS with PDAF more applicable for NIR radiation applications, it is important to improve NIR radiation sensitivity of the CIS with PDAF.

Some CIS with PDAF comprise an image sensing (IS) region and a PDAF region. The IS region comprises one or more IS pixels that are configured to detect (e.g., capture) an image. The PDAF region comprises a pair of PDAF pixels that are configured to determine a focus condition (e.g., correctly focused, focused too near, focused too far, etc.) of a specific point or area of the image. The focus condition is based on whether a phase difference exists between electrical signal(s) generated by PDAF photodetectors of the PDAF pixels. The CIS with PDAF is configured to output a focusing signal (e.g., an electrical signal) based on the focus condition, such that the electronic device can autofocus on the specific point or area of the image (e.g., the CIS with PDAF generates the focusing signal and provides the focusing signal to an actuator (e.g., electronic motor) of the electronic device, thereby causing the actuator to move an optical lens (e.g., main lens) of the electronic device to automatically focus on the specific point or area of the image).

For example, the pair of PDAF pixels comprises a first PDAF pixel and a second PDAF pixel. The first PDAF pixel comprises a first PDAF photodetector (e.g., photodiode) disposed in a first PDAF pixel region of a semiconductor substrate. The second PDAF pixel comprises a second PDAF photodetector (e.g., photodiode) disposed in a second PDAF pixel region of the semiconductor substrate. The first PDAF photodetector is configured to absorb incident EMR (e.g., photons) that is transmitted through a side (e.g., back-side) of the semiconductor substrate to the first PDAF pixel region and configured to generate a first electrical signal corresponding to the incident EMR transmitted to the first PDAF pixel region. The second PDAF photodetector is configured to absorb the incident EMR that is transmitted through the side of the semiconductor substrate to the second PDAF pixel region and configured to generate a second electrical signal corresponding to the incident EMR transmitted to the second PDAF pixel region.

An EMR shield (e.g., a metal shield) is disposed over the first PDAF pixel region and the second PDAF pixel region. The EMR shield is configured to block (e.g., reflect) the incident EMR (e.g., NIR radiation) from being transmitted to the first and second PDAF pixel regions. Typically, the EMR shield covers a right portion (e.g., a right half) of the first PDAF pixel region and a left portion (e.g., a left half) of the second PDAF pixel region, such that only a left portion of the first PDAF pixel region is open to receive the incident EMR and only a right portion of the second PDAF pixel region is open to receive the incident EMR. Thus, the incident EMR that is transmitted to the first PDAF pixel region and the incident EMR transmitted to the second PDAF pixel are dependent upon the angle of incidence of the incident EMR.

Therefore, the first electrical signal and the second electrical signal are dependent upon the angle of incidence of the incident EMR. Thus, an angular response curve (ARC) of the first PDAF pixel will be offset from a reference angle (e.g., a reference angle of incidence) in a first direction, and an ARC of the second PDAF pixel will be offset from the reference angle in a second direction opposite the first direction. An ARC describes sensitivity (e.g., quantum efficiency) as a function of angles of incidence of the incident EMR.

Thus, the pair of PDAF pixels can determine (e.g., via PDAF processing circuitry) the focus condition by comparing the first electrical signal to the second electrical signal to determine if a phase difference exists between the first and second electrical signals. Accordingly, the CIS with PDAF can output the focusing signal, which is based on the focus condition, so that the electronic device can autofocus on the specific point or area of the image. While the EMR shield allows the phase difference to be determined, the EMR shield negatively affects (e.g., reduces) NIR radiation sensitivity of the PDAF pixels due to the EMR shield blocking the incident NIR radiation from relatively large portions of the PDAF pixel regions. More specifically, the EMR shield reduces an angular response discrimination between the first PDAF pixel and the second PDAF pixel, and therefore makes it more challenging to determine a phase difference based on the incident NIR radiation.

Various embodiments of the present disclosure are directed toward an image sensor (e.g., an image sensor IC) with improved NIR radiation PDAF performance. The image sensor with improved NIR radiation PDAF performance comprises a pair of PDAF pixels. The PDAF pixels comprise a first PDAF pixel and a second PDAF pixel. The first PDAF pixel comprises a first PDAF photodetector disposed in a first PDAF pixel region of a semiconductor substrate. The second PDAF pixel comprises a second PDAF photodetector disposed in a second PDAF pixel region of the semiconductor substrate.

The first PDAF pixel region has a first side and a second side opposite the first side of the first PDAF pixel region. The second PDAF pixel region has a first side and a second side opposite the first side of the second PDAF pixel region. The first side of the first PDAF pixel region faces the first side of the second PDAF pixel region. An electromagnetic radiation (EMR) shield is disposed over a side (e.g., back-side) of the semiconductor substrate. The EMR shield is disposed outside the first PDAF pixel region (e.g., outside an outer perimeter of the first PDAF pixel region) and outside the second PDAF pixel region (e.g., outside an outer perimeter of the second PDAF pixel region).

A first EMR diffuser is disposed along the side of the semiconductor substrate and within the first PDAF pixel region. The first EMR diffuser is laterally spaced a first distance from the first side of the first PDAF pixel region, and the first EMR diffuser is laterally spaced from the second side of the first PDAF pixel region by a second distance that is less than the first distance. The first EMR diffuser is configured to diffuse (e.g., diffract) incident NIR radiation.

A second EMR diffuser is disposed along the side of the semiconductor substrate and within the second PDAF pixel region. The second EMR diffuser is laterally spaced a third distance from the first side of the second PDAF pixel region, and the second EMR diffuser is laterally spaced from the second side of the second PDAF pixel region by a fourth distance that is less than the third distance. The second EMR diffuser is also configured to diffuse (e.g., diffract) the incident NIR radiation. In some embodiments, the first distance is substantially equal to the third distance, and the second distance is substantially equal to the fourth distance.

Because the first EMR diffuser and the second EMR are configured to diffuse NIR radiation, and because the first EMR diffuser is laterally spaced the first distance from the first side of the first PDAF pixel region and the second EMR diffuser is laterally spaced the third distance from the first side of the second PDAF pixel region, the incident NIR radiation that is transmitted to the first PDAF pixel region and the NIR radiation that is transmitted to the second PDAF pixel region are dependent upon an angle of incidence of the incident NIR radiation. Thus, a phase difference can be determined (e.g., via PDAF processing circuitry) by comparing an electrical signal generated by the first PDAF photodetector to an electrical generated by the second PDAF photodetector. Accordingly, the image sensor can determine a focus condition based on the phase difference.

In comparison to a CIS comprising an EMR shield that covers the first PDAF pixel region and/or the second PDAF pixel region (e.g., covering half of the first PDAF pixel region and/or half of the second PDAF pixel region), more of the incident NIR radiation is transmitted to the first and second PDAF pixel regions because the EMR shield is disposed outside the first and second PDAF pixel regions (e.g., outside the outer perimeters of the first and second PDAF pixel regions). More specifically, due to more of the incident NIR radiation being transmitted to the first PDAF pixel region and the second PDAF pixel region, an angular response discrimination between the first PDAF pixel and the second PDAF pixel of the image sensor may be increased. Accordingly, the image sensor may have improved NIR radiation PDAF performance (e.g., increased NIR sensitivity, increased angular response discrimination, etc.).

FIG. 1 illustrates a cross-sectional view of some embodiments of an image sensor 100 with improved near-infrared (NIR) radiation phase detection autofocus (PDAF) performance.

As shown in FIG. 1, the image sensor 100 (e.g., an image sensor integrated chip (IC)) comprises a substrate 102. The substrate 102 comprises any type of semiconductor body (e.g., monocrystalline silicon/CMOS bulk, germanium (Ge), silicon-germanium (SiGe), gallium arsenide (GaAs), silicon on insulator (SOI), etc.). The substrate 102 may be doped (e.g., with n-type or p-type dopants) or undoped (e.g., intrinsic). In some embodiments, the substrate 102 has a first doping type (e.g., n-type).

The image sensor 100 comprises a phase detection autofocus (PDAF) region 101 and an image sensing (IS) region 103. In some embodiments, the substrate 102 extends continuously from the PDAF region 101 to the IS region 103 (as illustrated by the ellipsis ( . . . ) illustrated in FIG. 1). In other embodiments, the PDAF region 101 and the IS region 103 may be disposed on discrete substrates (e.g., the PDAF region 101 may be disposed on a first semiconductor substrate (e.g., PDAF IC) and the IS region 103 may be disposed on a second semiconductor substrate (e.g., IS IC) that is discrete (e.g., laterally and/or horizontally spaced) from the first semiconductor substrate).

One or more IS pixels 107 are disposed in the IS region 103. For example, a first IS pixel 107a is disposed in the IS region 103. The IS pixels 107 are configured to detect (e.g., capture) an image, details of which are described in more detail hereinafter. While FIG. 1 illustrates various features (e.g., structural features) of the first IS pixel 107a, it will be appreciated that each of the one or more IS pixels 107 may comprise substantially similar features (e.g., the structural features) as the first IS pixel 107a. Further, while FIG. 1 illustrates the image sensor 100 comprising the IS region 103 (e.g., a single IS region), it will be appreciated that the image sensor 100 may comprise any number of IS regions.

A pair of PDAF pixels 109 are disposed in the PDAF region 101. For example, the pair of PDAF pixels 109 comprises a first PDAF pixel 109a and a second PDAF pixel 109b that are disposed in the PDAF region 101. The pair of PDAF pixels 109 is configured to determine a focus condition (e.g., correctly focused, focused too near, focused too far, etc.) of a specific point or area of the image, details of which are described in more detail hereinafter. While FIG. 1 illustrates only the pair of PDAF pixels 109 (e.g., a single pair) disposed in the PDAF region 101, it will be appreciated that any number of pairs of PDAF pixels may be disposed in the PDAF region 101 and comprise substantially similar features (e.g., structural features) as the pair of PDAF pixels 109. Further, while FIG. 1 illustrates the image sensor 100 comprising the PDAF region 101 (e.g., a single PDAF region), it will be appreciated that the image sensor 100 may comprise any number of PDAF regions.

The substrate 102 comprises PDAF pixel regions 104 disposed in the PDAF region 101. The PDAF pixel regions 104 are laterally spaced. The PDAF pixel regions 104 are portions of the substrate 102 (e.g., undoped portions of the substrate 102 or portions of the substrate 102 having the first doping type). The PDAF pixels 109 comprise the PDAF pixel regions 104, respectively. For example, the substrate 102 comprises a first PDAF pixel region 104a and a second PDAF pixel region 104b. The first PDAF pixel 109a comprises the first PDAF pixel region 104a, and the second PDAF pixel 109b comprises the second PDAF pixel region 104b. The first PDAF pixel region 104a is laterally spaced from the second PDAF pixel region 104b.

The substrate 102 comprises an IS pixel region 105 disposed in the IS region 103. The IS pixel region 105 is a portion of the substrate 102 (e.g., an undoped portion of the substrate 102 or a portion of the substrate 102 having the first doping type). The first IS pixel 107a comprises the IS pixel region 105. In some embodiments, the IS pixel region 105 is laterally spaced from the PDAF pixel regions 104. The PDAF pixel regions 104 and the IS pixel region 105 are laterally separated by one or more isolation regions 106. In other words, the one or more isolation regions 106 laterally separate the first PDAF pixel region 104a, the second PDAF pixel region 104b, and the IS pixel region 105 from one another. In some embodiments, the PDAF pixel regions 104 and the IS pixel region 105 are laterally surrounded by the one or more isolation regions 106.

The substrate 102 has a front-side 102f and a back-side 102b. In some embodiments, one or more gate structures 110 may be disposed along the front-side 102f of the substrate 102 and within the PDAF pixel regions 104. In further embodiments, some of the one or more gate structures 110 may also be disposed along the front-side 102f of the substrate 102 and within the IS pixel region 105. In some embodiments, the one or more gate structures 110 may correspond to a transfer transistor, a source-follower transistor, a row select transistor, a reset transistor, a logic gate transistor (e.g., a transistor of a OR gate, a XOR gate, etc.), or some other transistor. In some embodiments, a first dielectric structure 112 is also arranged along the front-side 102f of the substrate 102 and on the one or more gate structures 110. The first dielectric structure 112 surrounds a plurality of conductive interconnect layers 114.

PDAF photodetectors 108 (e.g., photodiodes) are disposed in the substrate 102. In some embodiments, the PDAF photodetectors 108 comprise portions of the substrate 102 that have a second doping type (e.g., p-type) different than the first doping type, such that depletion regions exists in the substrate 102 (e.g., due to p-n junctions between the PDAF photodetectors 108 and the PDAF pixel regions 104). Further, the PDAF photodetectors 108 are disposed within the PDAF pixel regions 104, respectively. For example, a first PDAF photodetector 108a is disposed in the substrate 102 and within the first PDAF pixel region 104a, and a second PDAF photodetector 108b is disposed in the substrate 102 and within the second PDAF pixel region 104b. An IS photodetector 116 is disposed in the substrate 102. In some embodiments, the IS photodetector 116 comprises a portion of the substrate 102 having the second doping type (e.g., p-type), such that a depletion region exists in the substrate 102 (e.g., due to a p-n junction between the IS photodetector 116 and the IS pixel region 105). Further, the IS photodetector 116 is disposed within the IS pixel region 105.

The PDAF photodetectors 108 are configured to convert incident electromagnetic radiation (EMR) (e.g., photons) into electric signal(s) (e.g., to generate electron-hole pairs from the incident radiation). More specifically, the PDAF photodetectors 108 are configured to absorb the incident EMR that is transmitted through the back-side 102b of the substrate 102 to the PDAF pixel regions 104 and configured to generate electrical signals corresponding to the incident EMR. In some embodiments, the PDAF photodetectors 108 are configured to absorb incident NIR radiation (e.g., photons having a wavelength between about 750 nanometers (nm) and about 3 micrometers (um)) that is transmitted through the back-side 102b of the substrate 102 to the PDAF pixel regions 104 and configured to generate electrical signals corresponding to the incident NIR radiation. For example, the first PDAF photodetector 108a is configured to absorb incident NIR radiation that is transmitted through the back-side 102b of the substrate 102 to the first PDAF pixel region 104a and configured to generate an electrical signal corresponding to the incident NIR radiation that is transmitted to the first PDAF pixel region 104a, and the second PDAF photodetector 108b is configured to absorb the incident NIR radiation that is transmitted through the back-side 102b of the substrate 102 to the second PDAF pixel region 104b and configured to generate an electrical signal corresponding to the incident NIR radiation that is transmitted to the second PDAF pixel region 104b. It will be appreciated that, in other embodiments, the PDAF photodetectors 108 may be configured to absorb a different type of incident EMR (e.g., visible light, mid-infrared radiation, far infrared radiation, ultraviolet radiation, etc.) that is transmitted through the back-side 102b of the substrate 102 to the PDAF pixel regions 104 and configured to generate electrical signals corresponding to the different type of incident EMR.

The IS photodetector 116 is also configured to convert the incident EMR into an electrical signal. More specifically, the IS photodetector 116 is configured to absorb the incident EMR that is transmitted through the back-side 102b of the substrate 102 to the IS pixel region 105. In some embodiments, the IS photodetector 116 is configured to absorb incident visible light (e.g., photons having a wavelength between about 380 nm and about 750 nm) that is transmitted through the back-side 102b of the substrate 102 to the IS pixel region 105 and configured to generate an electrical signal corresponding to the incident visible light. In other embodiments, the IS photodetector 116 is configured to absorb the incident NIR radiation that is transmitted through the back-side 102b of the substrate 102 to the IS pixel region 105 and configured to generate an electrical signal corresponding to the incident NIR radiation. It will be appreciated that, in other embodiments, the IS photodetector 116 may be configured to absorb a different type of incident EMR (e.g., mid-infrared radiation, far infrared radiation, ultraviolet radiation, etc.) that is transmitted through the back-side 102b of the substrate 102 to the IS pixel region 105 and configured to generate an electrical signal corresponding to the different type of incident EMR.

The back-side 102b of the substrate 102 comprises a first plurality of PDAF diffusion surfaces 115 within the first PDAF pixel region 104a. The first plurality of PDAF diffusion surfaces 115 comprises a first PDAF diffusion surface 115a and a second PDAF diffusion surface 115b. The back-side 102b of the substrate 102 comprises a second plurality of PDAF diffusion surfaces 117 within the second PDAF pixel region 104b. The second plurality of PDAF diffusion surfaces 117 comprises a third PDAF diffusion surface 117a and a fourth PDAF diffusion surface 117b. In some embodiments, the back-side of the 102b of the substrate 102 comprises a plurality of IS diffusion surfaces 119 within the IS pixel region 105. The plurality of IS diffusion surfaces 119 comprises a first IS diffusion surface 119a and a second IS diffusion surface 119b. In some embodiments, the one or more isolation regions 106 comprises one or more isolation trenches 111 disposed within the back-side 102b of the substrate 102 and laterally separating the PDAF pixel regions 104 and the IS pixel region 105. In further embodiments, the one or more isolation trenches 111 laterally surround the PDAF pixel regions 104 and the IS pixel region 105.

An anti-reflective layer 120 is disposed along the back-side 102b of the substrate 102. The anti-reflective layer 120 lines the first plurality of PDAF diffusion surfaces 115, the second plurality of PDAF diffusion surfaces 117, and the plurality of IS diffusion surfaces 119. The anti-reflective layer 120 also extends vertically into the one or more isolation trenches 111. A second dielectric structure 122 is disposed on the anti-reflective layer 120. The second dielectric structure 122 may also extend to within the one or more isolation trenches 111 and directly between the first PDAF pixel region 104a, the second PDAF pixel region 104b, and the IS pixel region 105.

A plurality of EMR filters 124 (e.g., an infrared light filter, a red color filter, a blue color filter, a green color filter, etc.) are disposed on the second dielectric structure 122. In some embodiments, the EMR filters 124 are substantially centered over the PDAF pixel regions 104 and the IS pixel region 105. For example, the plurality of EMR filters 124 comprises a first EMR filter 124a disposed on the second dielectric structure 122 and substantially centered over the first PDAF pixel region 104a, a second EMR filter 124b disposed on the second dielectric structure 122 and substantially centered over the second PDAF pixel region 104b, and a third EMR filter 124c disposed on the second dielectric structure 122 and substantially centered over the IS pixel region 105. In some embodiments, the EMR filters 124 are arranged in an array a (e.g., 2×2 color filter array, 4×4 color filter array, 6×6 color filter array, etc.).

The EMR filters 124 are configured to transmit specific wavelengths (or specific ranges of wavelengths) of the incident EMR, respectively. For example, the first EMR filter 124a is configured to transmit EMR having wavelengths within a first range (e.g., corresponding to red light) while reflecting EMR outside of the first range, the second EMR filter 124b is configured to transmit EMR having wavelengths within a second range (e.g., corresponding to green light) while reflecting EMR outside of the second range, and the third EMR filter 124c is configured to transmit EMR having wavelengths within a third range (e.g., corresponding to blue light) while reflecting EMR outside of the third range. In some embodiments, the first range and the second range may be different (e.g., the first range may correspond to red light and the second range may correspond to blue light). In other embodiments, the first range and the second range may be the same (e.g., the first range and the second range may correspond to NIR radiation). In some embodiments, the third range may be different than the first range and/or the second range. In other embodiments, the third range may be the same as the first range and/or the second range.

A plurality of micro-lenses 126 are disposed on the EMR filters 124, respectively. In some embodiments, the micro-lenses 126 are laterally aligned with EMR filters 124, respectively. In further embodiments, the micro-lenses 126 are substantially centered over the PDAF pixel regions 104 and the IS pixel region 105. The micro-lenses 126 are configured to focus the incident EMR to the PDAF pixel regions 104 and the IS pixel region 105. For example, the plurality of micro-lenses 126 comprises a first micro-lens 126a, a second micro-lens 126b, and a third micro-lens 126c. The first micro-lens 126a is laterally aligned with the first EMR filter 124a, the second micro-lens 126b is laterally aligned with the second EMR filter 124b, and the third micro-lens 126c is laterally aligned with the third EMR filter 124c. The first micro-lens 126a is substantially centered over the first PDAF pixel region 104a, the second micro-lens 126b is substantially centered over the second PDAF pixel region 104b, and the third micro-lens 126c is substantially centered over the IS pixel region 105. The first micro-lens 126a is configured to focus the incident EMR to the first PDAF pixel region 104a, the second micro-lens 126b is configured to focus the incident EMR to the second PDAF pixel region 104b, and the third micro-lens 126c is configured to focus the incident EMR to the IS pixel region 105.

A plurality of EMR shields 128 are disposed vertically between the EMR filters 124 and the back-side 102b of the substrate 102. In some embodiments, the EMR shields 128 are disposed (e.g., embedded in) in the second dielectric structure 122. The EMR shields 128 are configured to block (e.g., reflect) some of the incident EMR. More specifically, the EMR shields 128 reduce cross-talk between adjacent pixel regions (e.g., the PDAF pixel regions 104 and/or the IS pixel region 105) by blocking (e.g., reflecting) the lateral propagation of the incident EMR (e.g., lateral propagation of NIR radiation passing through the micro-lenses 126).

The EMR shields 128 are disposed outside the PDAF pixel regions 104 and on opposite sides of the PDAF pixel regions 104. In some embodiments, the EMR shields 128 are also disposed outside the IS pixel region 105 and on opposite sides of the IS pixel region 105. For example, the plurality of EMR shields 128 comprises a first EMR shield 128a, a second EMR shield 128b, a third EMR shield 128c, a fourth EMR shield 128d, and a fifth EMR shield 128e that are disposed outside (e.g., outside the outer perimeters) of the first PDAF pixel region 104a, the second PDAF pixel region 104b, and the IS pixel region 105. The first EMR shield 128a is disposed on a first side 130 of the first PDAF pixel region 104a, and the second EMR shield 128b is disposed on a second side 132 of the first PDAF pixel region 104a opposite the first side 130 of the first PDAF pixel region 104a. The third EMR shield 128c is disposed on a first side 134 of the second PDAF pixel region 104b, and the second EMR shield 128b is disposed on a second side 136 of the second PDAF pixel region 104b opposite the first side 134 of the second PDAF pixel region 104b. The second side 132 of the first PDAF pixel region 104a faces the second side 136 of the second PDAF pixel region 140b. The fourth EMR shield 128d is disposed on a first side 138 of the IS pixel region 105, and the fifth EMR shield 128e is disposed on a second side 140 of the IS pixel region 105 opposite the first side 138 of the IS pixel region 105.

In some embodiments, the opposite sides of the PDAF pixel regions 104 are defined by sidewalls of the substrate 102. In further embodiments, the opposite sides of the IS pixel region 105 are also defined by sidewalls of the substrate 102. For example, as shown in FIG. 1, the first side 130 of the first PDAF pixel region 104a is defined by a first sidewall of the substrate 102, the second side 132 of the first PDAF pixel region 104a is defined by a second sidewall of the substrate 102, the first side 134 of the second PDAF pixel region 104b is defined by a third sidewall of the substrate 102, the second side 136 of the second PDAF pixel region 104b is defined by a fourth sidewall of the substrate 102, the first side 138 of the IS pixel region 105 is defined by a fifth sidewall of the substrate 102, and the second side 140 of the IS pixel region 105 is defined by a sixth sidewall of the substrate 102. The first, second, third, fourth, fifth, and sixth sidewalls of the substrate 102 are laterally spaced.

In some embodiments, the first, second, third, fourth, fifth, and/or sixth sidewalls of the substrate 102 extend vertically between the back-side 102b of the substrate 102 and the front-side 102f of the substrate 102 (e.g., the one or more isolation trenches 111 extend vertically through the substrate 102 from the back-side 102b of the substrate 102 to the front-side 102f of the substrate 102). In other embodiments, the first, second, third, fourth, fifth, and/or sixth sidewalls of the substrate 102 extend vertically from the back-side 102b of the substrate 102 to points in the substrate 102 disposed vertically between the back-side 102b of the substrate 102 and the front-side 102f of the substrate 102 (e.g., the one or more isolation trenches 111 vertically extend from the back-side 102b of the substrate 102 partially through the substrate 102). In some embodiments, the EMR shields 128 are disposed completely outside the PDAF pixel regions 104 and IS pixel region 105 (e.g., the EMR shields 128 do not cover (e.g., overlap) any portions of the PDAF pixel regions 104 or IS pixel region 105).

The first plurality of PDAF diffusion surfaces 115 form a first EMR diffuser cavity defining a first EMR diffuser 142. In other words, the first EMR diffuser 142 is disposed along the back-side 102b of the substrate 102. The first EMR diffuser 142 is disposed within the first PDAF pixel region 104a. The first EMR diffuser 142 is configured to diffuse (e.g., diffract) the incident EMR. More specifically, the first EMR diffuser 142 is configured to diffuse (e.g., diffract) the incident NIR radiation.

The second plurality of PDAF diffusion surfaces 117 form a second EMR diffuser cavity defining a second EMR diffuser 144. In other words, the second EMR diffuser 144 is disposed along the back-side 102b of the substrate 102. The second EMR diffuser 144 is disposed within the second PDAF pixel region 104b. The second EMR diffuser 144 is configured to diffuse (e.g., diffract) the incident EMR. More specifically, the second EMR diffuser 144 is configured to diffuse (e.g., diffract) the incident NIR radiation.

The plurality of IS diffusion surfaces 119 form a third EMR diffuser cavity defining a third EMR diffuser 146. In other words, the third EMR diffuser 146 is disposed along the back-side 102b of the substrate 102. The third EMR diffuser 146 is disposed within the IS pixel region 105. The third EMR diffuser 146 is configured to diffuse (e.g., diffract) the incident EMR. In some embodiments, the third EMR diffuser 146 is configured to diffuse (e.g., diffract) the incident NIR radiation. In other embodiments, the third EMR diffuser 146 may be configured to diffuse incident visible light (or some other type of EMR).

In some embodiments, the first EMR diffuser 142 is laterally spaced a first distance from the first side 130 of the first PDAF pixel region 104a, and the first EMR diffuser 142 is laterally spaced from the second side 132 of the first PDAF pixel region 104a by a second distance that is less than the first distance. In further embodiments, the second EMR diffuser 144 is laterally spaced a third distance from the first side 134 of the second PDAF pixel region 104b, and the second EMR diffuser 144 is laterally spaced from the second side 136 of the second PDAF pixel region 104b by a fourth distance that is less than the third distance. In yet further embodiments, the first distance is substantially equal to the third distance, and the second distance is substantially equal to the fourth distance.

During operation of the image sensor 100, the third micro-lens 126c is configured to focus the incident EMR 148 (e.g., NIR radiation) toward the IS pixel region 105. The IS photodetector 116 absorbs the incident EMR 148 in the IS pixel region 105 and generates an electrical signal(s) corresponding to the incident EMR 148 in the pixel region 105. Thus, the image sensor 100 can detect (e.g., capture) an image by processing the electrical signal(s) generated by the IS photodetector 116. More specifically, the image sensor 100 detects the image by processing electrical signals generated by the IS photodetectors of the one or more IS pixels 107.

In some embodiments, the third EMR diffuser 146 diffuses some of the incident EMR 148 focused by the third micro-lens 126c before it enters the IS pixel region 105. The incident EMR 148 that is diffused by the third EMR diffuser 146 depends upon an angle of incidence θ of the incident EMR 148. For example, the third micro-lens 126c focuses the incident EMR 148 to a focal point that is dependent upon the angle of incidence θ of the incident EMR 148. Thus, some of the incident EMR 148 focused by the third micro-lens 126c will strike the third EMR diffuser 146. A portion of the incident EMR 148 that strikes the third EMR diffuser 146 is then reflected to within the third EMR diffuser 146, where the reflected incident EMR 148 can strike another surface of the substrate 102 and subsequently enter the IS pixel region 105. Because the third EMR diffuser 146 reflects the incident EMR 148, the incident EMR 148 will enter the IS pixel region 105 at different angles (e.g., the incident EMR 148 is diffused). The different angles allow for some of the incident EMR 148 to enter the IS pixel region 105 along angles that increase a path length of the incident EMR 148 in the IS pixel region 105. By increasing a path length of the incident EMR 148 in the IS pixel region 105, absorption of the incident EMR 148 in the IS pixel region 105 may be increased.

The first micro-lens 126a is configured to focus the incident EMR 148 toward the first PDAF pixel region 104a. Because the first EMR diffuser 142 is laterally spaced the first distance from the first side 130 of the first PDAF pixel region 104a and the second distance from the second side 132 of the first PDAF pixel region 104a, the first EMR diffuser 142 diffuses a portion of the incident EMR 148 that is focused by the first micro-lens 126a before it enters the first PDAF pixel region 104a. The portion of the incident EMR 148 that is focused by the first micro-lens 126a and diffused by the first EMR diffuser 142 depends upon the angle of incidence θ of the incident EMR 148 (e.g., due to the first micro-lens 126a focusing the incident EMR 148 to a focal point that is dependent upon the angle of incidence θ of the incident EMR 148).

Similarly, the second micro-lens 126b is configured to focus the incident EMR 148 toward the second PDAF pixel region 104b. Because the second EMR diffuser 144 is laterally spaced the third distance from the first side 134 of the second PDAF pixel region 104b and laterally spaced the fourth distance from the second side 136 of the second PDAF pixel region 104b, the second EMR diffuser 14 diffuses a portion of the incident EMR 148 that is focused by the second micro-lens 126b before it enters the second PDAF pixel region 104b. The portion of the incident EMR 148 that is focused by the second micro-lens 126b and diffused by the second EMR diffuser 144 depends upon the angle of incidence θ of the incident EMR 148 (e.g., due to the second micro-lens 126b focusing the incident EMR 148 to a focal point that is dependent upon the angle of incidence θ of the incident EMR 148).

Therefore, the electrical signal generated by the first PDAF photodetector 108a will be based at least partially on the portion of the incident EMR 148 that is diffused by the first EMR diffuser 142, which is dependent upon the angle of incidence θ of the incident EMR 148, and the electrical signal generated by the second PDAF photodetector 108b will be based at least partially on the portion of the incident EMR 148 that is diffused by the second EMR diffuser 144, which is also dependent upon the angle of incidence θ of the incident EMR 148. Thus, an angular response curve (ARC) of the first PDAF pixel 109a will be offset from a reference angle (e.g., a reference angle of incidence, such as zero degrees) in a first direction, and an ARC of the second PDAF pixel 109b will be offset from the reference angle in a second direction opposite the first direction.

Thus, the pair of PDAF pixels 109 can determine (e.g., via PDAF processing circuitry) the focus condition by comparing the electrical signal generated by the first PDAF photodetector 108a to the electrical signal generated by the second PDAF photodetector 108b to determine if a phase difference exists between the electrical signal generated by the first PDAF photodetector 108a and the electrical signal generated by the second PDAF photodetector 108b. More specifically, the image sensor 100 can determine if the phase difference exists by determining if the electrical signal generated by the first PDAF photodetector 108a is different than the electrical signal generated by the second PDAF photodetector 108b (e.g., a difference in current and/or voltage). If there is a difference between the electrical signals generated by the first PDAF photodetector 108a and the second PDAF photodetector 108b, a phase difference exists (e.g., the image is out of focus). On the other hand, if the electrical signals generated by the first PDAF photodetector 108a and the second PDAF photodetector 108b are substantially the same, a phase difference does not exist (e.g., the image is in focus). Accordingly, the image sensor 100 can determine the focus condition based on the phase difference. In some embodiments, the image sensor 100 outputs focusing signal(s) based on the focus condition (e.g., so that a specific point or area of the image can be automatically focused on).

In comparison to an image sensor comprising an EMR shield that covers the first PDAF pixel region 104a and/or the second PDAF pixel region 104b (e.g., covering half of the first PDAF pixel region 104a and/or half of the second PDAF pixel region 104b), the first micro-lens 126a and the second micro-lens 126b transmit more of the incident EMR 148 to the first PDAF pixel region 104a and the second PDAF pixel region 104b, respectively, due to the plurality of EMR shields 128 being disposed outside the PDAF pixel regions 104. More specifically, due to more of the incident EMR 148 being transmitted to the first PDAF pixel region 104a and the second PDAF pixel region 104b, an angular response discrimination between the first PDAF pixel 109a and the second PDAF pixel 109b of the image sensor 100 may be increased. Accordingly, the image sensor 100 may have improved NIR radiation PDAF performance (e.g., increased NIR sensitivity, increased angular response discrimination, etc.).

Figure 2:
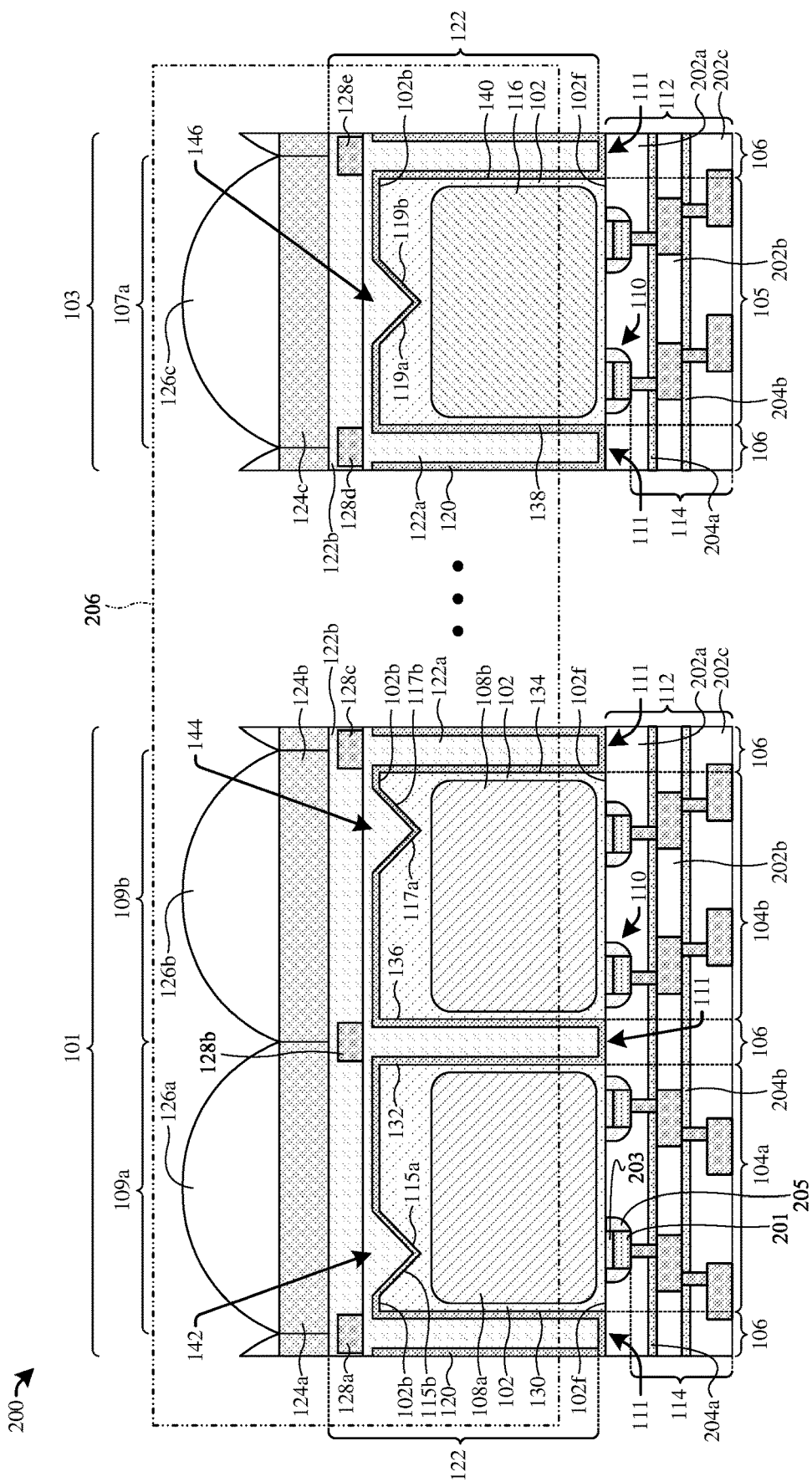
FIG. 2 illustrates a cross-sectional view of the image sensor of FIG. 1 according to some embodiments.

FIG. 2 illustrates a cross-sectional view 200 of the image sensor 100 of FIG. 1 according to some embodiments.

As shown in the cross-sectional view 200 of FIG. 2, the first dielectric structure 112 surrounds a plurality of conductive interconnect layers 114. The first dielectric structure 112 comprises a plurality of stacked inter-level dielectric (ILD) layers 202. For example, the plurality of stacked ILD layers 202 comprises a first ILD layer 202a, a second ILD layer 202b, and a third ILD layer 202c. In some embodiments, the plurality of stacked ILD layers 202 comprise, for example, an oxide (e.g., silicon dioxide ($SiO_2$)) an oxy-nitride (e.g., silicon oxy-nitride (SiON)), doped silicon dioxide (e.g., carbon doped silicon dioxide), borosilicate glass (BSG), phosphoric silicate glass (PSG), borophosphosilicate glass (BPSG), fluorinated silicate glass (FSG), or the like.

The plurality of conductive interconnect layers 114 comprise alternating layers of conductive vias (e.g., metal vias)

and conductive wires (e.g., metal wires), which are disposed (e.g., embedded) in the plurality of stacked ILD layers 202 and electrically coupled to the one or more gate structures 110 in a predefined manner. In some embodiments, the plurality of conductive interconnect layers 114 comprise, for example, tungsten (W), copper (Cu), aluminum (Al), or the like. In further embodiments, some of the one or more gate structures 110 may be part of a PDAF circuit of the image sensor 100 configured to process the electrical signals generated by the PDAF photodetectors 108. In yet further embodiments, some other of the one or more gate structures 110 may be part of an IS circuit of the image sensor 100 configured to process the electrical signals generated by the IS photodetector 116. In some embodiments, the one or more gate structures 110 each comprise a conductive gate electrode structure 201 separated from the substrate 102 by a gate dielectric structure 203. In further embodiments, a sidewall spacer 205 is disposed along opposite sides of the conductive gate electrode structure 201 of each of the one or more gate structures 110.

In some embodiments, the conductive gate electrode structure 201 comprises polysilicon. In such embodiments, the gate dielectric structure 203 may comprise, for example, an oxide (e.g., SiO$_2$), a nitride (e.g., silicon nitride (SiN)), or the like. In other embodiments, the conductive gate electrode structure 201 may comprise a metal, such as aluminum (Al), copper (Cu), titanium (Ti), tantalum (Ta), tungsten (W), molybdenum (Mo), cobalt (Co), or the like. In such embodiments, the gate dielectric structure 203 may comprise a high-k dielectric material, such as hafnium oxide (HfO), tantalum oxide (TaO), hafnium silicon oxide (HfSiO), hafnium tantalum oxide (HMO), aluminum oxide (AlO), zirconium oxide (ZrO), or the like. In some embodiments, the sidewall spacer 205 may comprise an oxide (e.g., SiO$_2$), a nitride (e.g., SiN), an oxy-nitride (e.g., SiON), a carbide (e.g., silicon carbide (SiC)), or the like.

In some embodiments, etch stop layers 204 are arranged between adjacent ones of the plurality of stacked ILD layers 202. For example, a first etch stop layer 204a is disposed between the first ILD layer 202a and the second ILD layer 202b, and a second etch stop layer 204b is disposed between the second ILD layer 202b and the third ILD layer 202c. In some embodiments, the etch stop layers 204 comprise, for example, a nitride (e.g., SiN), an oxy-nitride (e.g., SiON), a carbide (e.g., SiC), a metal nitride (e.g., titanium nitride (TiN), tantalum nitride (TaN), etc.), or the like. In further embodiments, the etch stop layers 204 may be configured to pass the incident EMR through the etch stop layers 204. In such embodiments, the etch stop layers 204 may improve (e.g., increase) NIR radiation PDAF performance (e.g., NIR sensitivity) by preventing the incident EMR from being reflected back toward the substrate 102. In other embodiments, the etch stop layers 204 may be configured to reflect the incident EMR. In such embodiments, the etch stop layers 204 may improve (e.g., increase) NIR radiation PDAF performance (e.g., NIR sensitivity) by reflecting the incident EMR back into the substrate 102 and/or preventing incident EMR from passing through the first dielectric structure 112 into the substrate 102.

In some embodiments, the second dielectric structure 122 comprises a first dielectric layer 122a and a second dielectric layer 122b. The first dielectric layer 122a is disposed over the anti-reflective layer 120. In some embodiments, the anti-reflective layer 120 comprises, for example, an oxide (e.g., SiO$_2$), a nitride (e.g., SiN), a carbide (e.g., SiC), a high-k dielectric (e.g., HfO, TaO, etc.), or the like. The first dielectric layer 122a extends within the one or more isolation trenches 111 to define isolation structures (e.g., backside deep trench isolation structure) on opposite sides of the PDAF pixel regions 104 and opposite sides of the IS pixel region 105. In some embodiments, the first dielectric layer 122a comprises, for example, an oxide (e.g., SiO$_2$), a nitride (e.g., SiN), a carbide (e.g., SiC), a high-k dielectric (HfO, TaO, etc.), or the like.

In some embodiments, the EMR shields 128 are disposed over the first dielectric layer 122a. In further embodiments, the second dielectric layer 122b is disposed on and covers the EMR shields 128. The EMR shields 128 may comprise a metal (e.g., aluminum (Al), cobalt (Co), copper (Cu), silver (Ag), gold (Au), tungsten (W), etc.) and/or a dielectric material (e.g., SiO$_2$, SiN, etc.).

The second dielectric layer 122b is disposed over the first dielectric layer 122a. The plurality of EMR filters 124 are disposed on the second dielectric layer 122b. The second dielectric layer 122b is disposed vertically between the first dielectric layer 122a and the plurality of EMR filters 124. In some embodiments, the second dielectric layer 122b laterally surrounds the EMR shields 128 and covers upper surfaces of the EMR shields 128. In some embodiments, the second dielectric layer 122b comprises, for example, an oxide (e.g., SiO$_2$), a nitride (e.g., SiN), a carbide (e.g., SiC), a high-k dielectric (e.g., HfO, TaO, etc.), or the like. In further embodiments, the first dielectric layer 122a and the second dielectric layer 122b are a same material. In other embodiments, the first dielectric layer 122a and the second dielectric layer 122b may comprise different materials.

The anti-reflective layer 120 lines the first plurality of PDAF diffusion surfaces 115, the second plurality of PDAF diffusion surfaces 117, and the plurality of IS diffusion surfaces 119. In other words, the anti-reflective layer 120 lines the first EMR diffuser cavity, the second EMR diffuser cavity, and the third EMR diffuser cavity. In yet other words, the anti-reflective layer 120 lines the first EMR diffuser 142, the second EMR diffuser 144, and the third EMR diffuser 146. The first dielectric layer 122a is disposed within the first EMR diffuser 142, the second EMR diffuser 144, and the third EMR diffuser 146. In other words, first dielectric layer 122a is disposed in the first EMR diffuser cavity, the second EMR diffuser cavity, and the third EMR diffuser cavity. In further embodiments, the first dielectric layer 122a fills (e.g., completely fills) the first EMR diffuser cavity, the second EMR diffuser cavity, and the third EMR diffuser cavity.

The first dielectric layer 122a has a first refractive index. The anti-reflective layer 120 has a second refractive index. The substrate 102 has a third refractive index. In other words, the PDAF pixel regions 104 and the IS pixel region 105 have the third refractive index. The first refractive index is greater than the third refractive index. The second refractive index is between the first refractive index and the third refractive index. Because the second refractive index is between the first refractive index and the third refractive index, the anti-reflective layer 120 is configured to reduce reflections of the incident EMR, which may increase NIR radiation PDAF performance (e.g., by increasing the absorption of the incident EMR in the substrate 102). Because the first refractive index and the second refractive index are less than the third refractive index, the first EMR diffuser 142, the second EMR diffuser 144, and the third EMR diffuser 146 are configured to diffuse the incident EMR, thereby increasing NIR radiation PDAF performance (e.g., NIR sensitivity).

In some embodiments, the third refractive index is greater than about 3. More specifically, the third refractive index may be between about 3.5 and about 3.7. The first refractive index is less than about 3. The second refractive index is less than about 3. The first refractive index and the second refractive index are such that in conjunction with the shape the EMR diffusers (e.g., the first EMR diffuser 142, the second EMR diffuser 144, and the third EMR diffuser 146), the EMR diffusers are configured to diffuse NIR radiation. In other words, the materials of the first dielectric layer 122*a* and the anti-reflective layer 120 are chosen, at least partially, on the shape of the EMR diffusers, or vice versa. It will be appreciated that, in other embodiments, the first dielectric layer 122*a* may line the first plurality of PDAF diffusion surfaces 115, the second plurality of PDAF diffusion surfaces 117, and the plurality of IS diffusion surfaces 119 (e.g., the anti-reflective layer 120 is not disposed between the first dielectric layer 122*a* and the back-side 102*b* of the substrate 102). It will further be appreciated that a different dielectric structure (having a refractive index less than the third refractive index) may be disposed within the first EMR diffuser 142, the second EMR diffuser 144, and the third EMR diffuser 146 (e.g., a different dielectric material than the first dielectric layer 122*a*).

Figure 3:
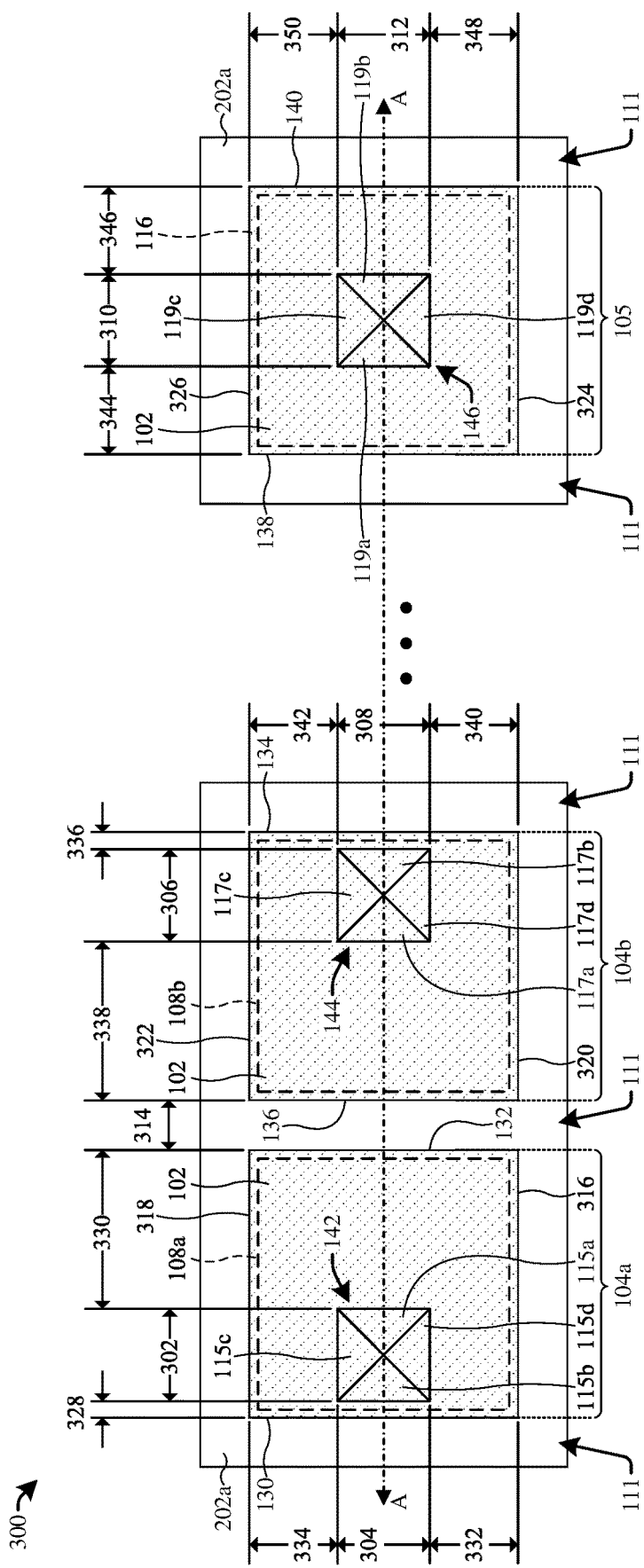
FIG. 3 illustrates a simplified top view of the image sensor of FIG. 2 according to some embodiments.

FIG. 3 illustrates a simplified top view 300 of the image sensor 100 of FIG. 2 according to some embodiments. The simplified top view 300 of FIG. 3 is "simplified" because the simplified top view 300 of FIG. 3 does not illustrate the anti-reflective layer 120 or the second dielectric structure 122 illustrated in the cross-sectional view 200 of FIG. 2. The cross-sectional view 200 of FIG. 2 is taken along line A-A of FIG. 3.

As shown in the simplified top view 300 of FIG. 3, the first EMR diffuser 142 has a width 302 and a length 304. In some embodiments, the width 302 of the first EMR diffuser 142 is substantially the same as the length 304 of the first EMR diffuser 142. In other embodiments, the width 302 of the first EMR diffuser 142 is different than the length 304 of the first EMR diffuser 142.

In some embodiments, the width 302 of the first EMR diffuser 142 is between about 0.1 micrometers (um) and about 1.5 um. More specifically, the width 302 of the first EMR diffuser 142 is between about 0.3 um and about 1.3 um. Because the width 302 of the first EMR diffuser 142 is between about 0.3 um and about 1.3 um, the first EMR diffuser 142 is capable of diffusing the incident EMR (e.g., NIR radiation). In further embodiments, the length 304 of the first EMR diffuser 142 is between about 0.1 um and about 1.5 um. More specifically, the length 304 of the first EMR diffuser 142 is between about 0.3 um and about 1.3 um. Because the length 304 of the first EMR diffuser 142 is between about 0.3 um and about 1.3 um, the first EMR diffuser 142 is capable of diffusing the incident EMR. More specifically, because both the width 302 and the length 304 of the first EMR diffuser 142 are between about 0.3 um and about 1.3 um, the first EMR diffuser 142 is capable of diffusing the incident EMR.

The second EMR diffuser 144 has a width 306 and a length 308. In some embodiments, the width 306 of the second EMR diffuser 144 is between about 0.1 um and about 1.5 um. More specifically, the width 306 of the second EMR diffuser 144 is between about 0.3 urn and about 1.3 um. Because the width 306 of the second EMR diffuser 144 is between about 0.3 um and about 1.3 um, the second EMR diffuser 144 is capable of diffusing the incident EMR. In further embodiments, the length 308 of the second EMR diffuser 144 is between about 0.1 um and about 1.5 um. More specifically, the length 308 of the second EMR diffuser 144 is between about 0.3 um and about 1.3 um. Because the length 308 of the second EMR diffuser 144 is between about 0.3 um and about 1.3 um, the second EMR diffuser 144 is capable of diffusing the incident EMR. More specifically, because both the width 306 and the length 308 of the second EMR diffuser 144 are between about 0.3 um and about 1.3 um, the second EMR diffuser 144 is capable of diffusing the incident EMR.

In some embodiments, the width 306 of the second EMR diffuser 144 is substantially the same as the length 308 of the second EMR diffuser 144. In other embodiments, the width 306 of the second EMR diffuser 144 is different than the length 308 of the second EMR diffuser 144. In further embodiments, the width 302 of the first EMR diffuser 142 is substantially the same as the width 306 of the second EMR diffuser 144. In other embodiments, the width 302 of the first EMR diffuser 142 is different than the width 306 of the second EMR diffuser 144. In further embodiments, the length 304 of the first EMR diffuser 142 is substantially the same as the length 308 of the second EMR diffuser 144. In other embodiments, the length 304 of the first EMR diffuser 142 is different than the length 308 of the second EMR diffuser 144. In yet further embodiments, the width 302 of the first EMR diffuser 142 is substantially the same as the width 306 of the second EMR diffuser 144 and the length 304 of the first EMR diffuser 142 is substantially the same as the length 308 of the second EMR diffuser 144. Because the width 302 of the first EMR diffuser 142 is substantially the same as the width 306 of the second EMR diffuser 144 and the length 304 of the first EMR diffuser 142 is substantially the same as the length 308 of the second EMR diffuser 144, the image sensor 100 may have improved NIR radiation PDAF performance (e.g., due to a larger angular response discrimination between the first PDAF pixel 109*a* and the second PDAF pixel 109*b*).

The third EMR diffuser 146 has a width 310 and a length 312. In some embodiments, the width 310 of the third EMR diffuser 146 is substantially the same as the length 312 of the third EMR diffuser 146. In other embodiments, the width 310 of the third EMR diffuser 146 is different than the length 312 of the third EMR diffuser 146. In further embodiments, the width 310 of the third EMR diffuser 146 is substantially the same as the width 302 of the first EMR diffuser 142 and/or the width 306 of the second EMR diffuser 144. In other embodiments, the width 310 of the third EMR diffuser 146 is different than the width 302 of the first EMR diffuser 142 and/or the width 306 of the second EMR diffuser 144. In further embodiments, the length 312 of the third EMR diffuser 146 is substantially the same as the length 304 of the first EMR diffuser 142 and/or the length 308 of the second EMR diffuser 144. In other embodiments, the length 312 of the third EMR diffuser 146 is different than the length 304 of the first EMR diffuser 142 and/or the length 308 of the second EMR diffuser 144.

The second side 132 of the first PDAF pixel region 104*a* faces the second side 136 of the second PDAF pixel region 104*b*. The second side 132 of the first PDAF pixel region 104*a* is laterally spaced from the second side 136 of the second PDAF pixel region 104*b* by a first distance 314. In some embodiments, the first distance 314 is between about 0.1 um and about 0.3 um. In further embodiments, the first distance 314 corresponds to a width of the one or more isolation trenches 111. In yet further embodiments, the one or more isolation trenches 111 are portions of an isolation trench grid that extends laterally through the substrate 102, such that the isolation trench grid laterally surrounds the PDAF pixel regions 104 (and the IS pixel region 105), as shown in the simplified top view 300 of FIG. 3.

The first PDAF pixel region 104a has a third side 316 of the first PDAF pixel region 104a and a fourth side 318 of the first PDAF pixel region 104a. The fourth side 318 of the first PDAF pixel region 104a is opposite the third side 316 of the first PDAF pixel region 104a. In some embodiments, the first side 130, the second side 132, the third side 316, and the fourth side 318 of the first PDAF pixel region 104a are defined by sidewalls of the substrate 102. The first side 130 of the first PDAF pixel region 104a and the second side 132 of the first PDAF pixel region 104a are laterally spaced in a first direction, and the third side 316 of the first PDAF pixel region 104a and the fourth side 318 of the first PDAF pixel region 104a are laterally spaced in a second direction perpendicular to the first direction.

The second PDAF pixel region 104b has a third side 320 of the second PDAF pixel region 104b and a fourth side 322 of the second PDAF pixel region 104b. The fourth side 322 of the second PDAF pixel region 104b is opposite the third side 320 of the second PDAF pixel region 104b. In some embodiments, the first side 134, the second side 136, the third side 320, and the fourth side 322 of the second PDAF pixel region 104b are defined by sidewalls of the substrate 102. The first side 134 of the second PDAF pixel region 104b and the second side 136 of the second PDAF pixel region 104b are laterally spaced in the first direction, and the third side 320 of the second PDAF pixel region 104b and the fourth side 322 of the second PDAF pixel region 104b are laterally spaced in the second direction.

The IS pixel region 105 has a third side 324 of the IS pixel region 105 and a fourth side 326 of the IS pixel region 105. The fourth side 326 of the IS pixel region 105 is opposite the third side 324 of the IS pixel region 105. In some embodiments, the first side 138, the second side 140, the third side 324, and the fourth side 326 of the IS pixel region 105 are defined by sidewalls of the substrate 102. The first side 138 of the IS pixel region 105 and the second side 140 of the IS pixel region 105 are laterally spaced in the first direction, and the third side 324 of the IS pixel region 105 and the fourth side 326 of the IS pixel region 105 are laterally spaced in the second direction.

The back-side 102b of the substrate 102 comprises the first plurality of PDAF diffusion surfaces 115 within the first PDAF pixel region 104a. The first plurality of PDAF diffusion surfaces 115 comprises the first PDAF diffusion surface 115a, the second PDAF diffusion surface 115b, a fifth PDAF diffusion surface 115c, and a sixth PDAF diffusion surface 115d. The first plurality of PDAF diffusion surfaces 115 form the first EMR diffuser cavity defining the first EMR diffuser 142. In some embodiments, the back-side 102b of the substrate 102 comprises a substantially planar (e.g., flat) surface(s) that extends continuously from the first plurality of PDAF diffusion surfaces 115 to the first side 130, the second side 132, the third side 316, and the fourth side 318 of the first PDAF pixel region 104a.

The back-side 102b of the substrate 102 comprises the second plurality of PDAF diffusion surfaces 117 within the second PDAF pixel region 104b. The second plurality of PDAF diffusion surfaces 117 comprises the third PDAF diffusion surface 117a, the fourth PDAF diffusion surface 117b, a seventh PDAF diffusion surface 117c, and an eighth PDAF diffusion surface 117d. The second plurality of PDAF diffusion surfaces 117 form the second EMR diffuser cavity defining the second EMR diffuser 144. In some embodiments, the back-side 102b of the substrate 102 comprises a substantially planar (e.g., flat) surface(s) that extends continuously from the second plurality of PDAF diffusion surfaces 117 to the first side 134, the second side 136, the third side 320, and the fourth side 322 of the second PDAF pixel region 104b.

The first EMR diffuser 142 is spaced a second distance 328 from the first side 130 of the first PDAF pixel region 104a. The first EMR diffuser 142 is spaced a third distance 330 from the second side 132 of the first PDAF pixel region 104a. The first EMR diffuser 142 is spaced a fourth distance 332 from the third side 316 of the first PDAF pixel region 104a. The first EMR diffuser 142 is spaced a fifth distance 334 from the fourth side 318 of the first PDAF pixel region 104a. In some embodiments, the first EMR diffuser 142 has an inverted pyramid-like shape (e.g., an inverted square pyramid, an inverted rectangular pyramid, an inverted triangular pyramid, etc.), as shown in the simplified top view 300 of FIG. 3. In further embodiments, the inverted pyramid-like shape of the first EMR diffuser 142 may be truncated (e.g., a lower surface of the first EMR diffuser cavity may be substantially planar).

In some embodiments, the second distance 328 is different than the third distance 330. In further embodiments, the second distance 328 is less than the third distance 330. In other words, the first EMR diffuser 142 is disposed nearer the first side 130 of the first PDAF pixel region 104a than the second side 132 of the first PDAF pixel region 104a. The fourth distance 332 may substantially the same as the fifth distance 334.

The second EMR diffuser 144 is spaced a sixth distance 336 from the first side 134 of the second PDAF pixel region 104b. The second EMR diffuser 144 is spaced a seventh distance 338 from the second side 136 of the second PDAF pixel region 104b. The second EMR diffuser 144 is spaced an eighth distance 340 from the third side 320 of the second PDAF pixel region 104b. The second EMR diffuser 144 is spaced a ninth distance 342 from the fourth side 322 of the second PDAF pixel region 104b. In some embodiments, the second EMR diffuser 144 has an inverted pyramid-like shape, as shown in the simplified top view 300 of FIG. 3. In further embodiments, the inverted pyramid-like shape of the second EMR diffuser 144 may be truncated. In further embodiments, the shape of the second EMR diffuser 144 (e.g., inverted pyramid-like) is substantially the same as the shape of the first EMR diffuser 142 (e.g., inverted pyramid-like).

In some embodiments, the sixth distance 336 is different than the seventh distance 338. In further embodiments, the sixth distance 336 is less than the seventh distance 338. In other words, the second EMR diffuser 144 is disposed nearer the first side 134 of the second PDAF pixel region 104b than the second side 136 of the second PDAF pixel region 104b. The eighth distance 340 may be substantially the same as the ninth distance 342.

The second distance 328 is substantially the same as the sixth distance 336, the third distance 330 is substantially the same as the seventh distance 338, the fourth distance 332 is substantially the same as the eighth distance 340, and the fifth distance 334 is substantially the same as the ninth distance 342. Thus, the pair of PDAF pixels 109 may determine (e.g., via PDAF processing circuitry) the focus condition by comparing the electrical signal generated by the first PDAF photodetector 108a to the electrical signal generated by the second PDAF photodetector 108b to determine if a phase difference exists between the electrical signal generated by the first PDAF photodetector 108a and the electrical signal generated by the second PDAF photodetector 108b.

In some embodiments, the first PDAF pixel region 104a and the second PDAF pixel region 104b are symmetrical, as shown in the simplified top view 300 of FIG. 3. In further embodiments, the first PDAF pixel region 104a and the second PDAF pixel region 104b are symmetrical because the shape of the second EMR diffuser 144 is substantially the same as the shape of the first EMR diffuser 142, the width 302 of the first EMR diffuser 142 is substantially the same as the width 306 of the second EMR diffuser 144, the length 304 of the first EMR diffuser 142 is substantially the same as the length 308 of the second EMR diffuser 144, the second distance 328 is substantially the same as the sixth distance 336, the third distance 330 is substantially the same as the seventh distance 338, the fourth distance 332 is substantially the same as the eighth distance 340, and the fifth distance 334 is substantially the same as the ninth distance 342. Because the first PDAF pixel region 104a and the second PDAF pixel region 104b are symmetrical, the NIR radiation PDAF performance of the image sensor 100 may be further improved (e.g., due to a larger angular response discrimination between the first PDAF pixel 109a and the second PDAF pixel 109b).

The back-side 102b of the substrate 102 comprises the plurality of IS diffusion surfaces 119 within the IS pixel region 105. The plurality of IS diffusion surfaces 119 comprises the first IS diffusion surface 119a, the second IS diffusion surface 119b, a third IS diffusion surface 119c, and a fourth IS diffusion surface 119d. The plurality of IS diffusion surfaces 119 form the third EMR diffuser cavity defining the third EMR diffuser 146. In some embodiments, the back-side 102b of the substrate 102 comprises a substantially planar (e.g., flat) surface(s) that extends continuously from the plurality of IS diffusion surfaces 119 to the first side 138, the second side 140, the third side 324, and the fourth side 326 of the IS pixel region 105.

The third EMR diffuser 146 is spaced a tenth distance 344 from the first side 138 of the IS pixel region 105. The third EMR diffuser 146 is spaced an eleventh distance 346 from the second side 140 of the IS pixel region 105. The third EMR diffuser 146 is spaced a twelfth distance 348 from the third side 324 of the IS pixel region 105. The third EMR diffuser 146 is spaced a thirteenth distance 350 from the fourth side 326 of the IS pixel region 105. In some embodiments, the third EMR diffuser 146 has an inverted pyramid-like shape, as shown in the simplified top view 300 of FIG. 3. In further embodiments, the inverted pyramid-like shape of the third EMR diffuser 146 may be truncated (e.g., a lower surface of the second EMR diffuser cavity may be substantially planar). In further embodiments, the shape of the third EMR diffuser 146 is substantially the same as the shape of the second EMR diffuser 144 and/or the first EMR diffuser 142. In other embodiments, the shape of the third EMR diffuser 146 may be different than the shape of the second EMR diffuser 144 and/or the first EMR diffuser 142.

In some embodiments, the tenth distance 344, the eleventh distance 346, the twelfth distance 348, and the thirteenth distance 350 are substantially the same. It will be appreciated that, in other embodiments, any one of the tenth distance 344, the eleventh distance 346, the twelfth distance 348, or the thirteenth distance 350 may be different than (or the same) as any other one of the tenth distance 344, the eleventh distance 346, the twelfth distance 348, or the thirteenth distance 350. In some embodiments, the tenth distance 344 is greater than the second distance 328 and/or the sixth distance 336. The eleventh distance 346 may be greater than the second distance 328 and/or the sixth distance 336. In further embodiments, the twelfth distance 348 is substantially the same as the fourth distance 332 and/or the eighth distance 340. The thirteenth distance 350 may be substantially the same as the fifth distance 334 and/or the ninth distance 342.

Figure 4A:
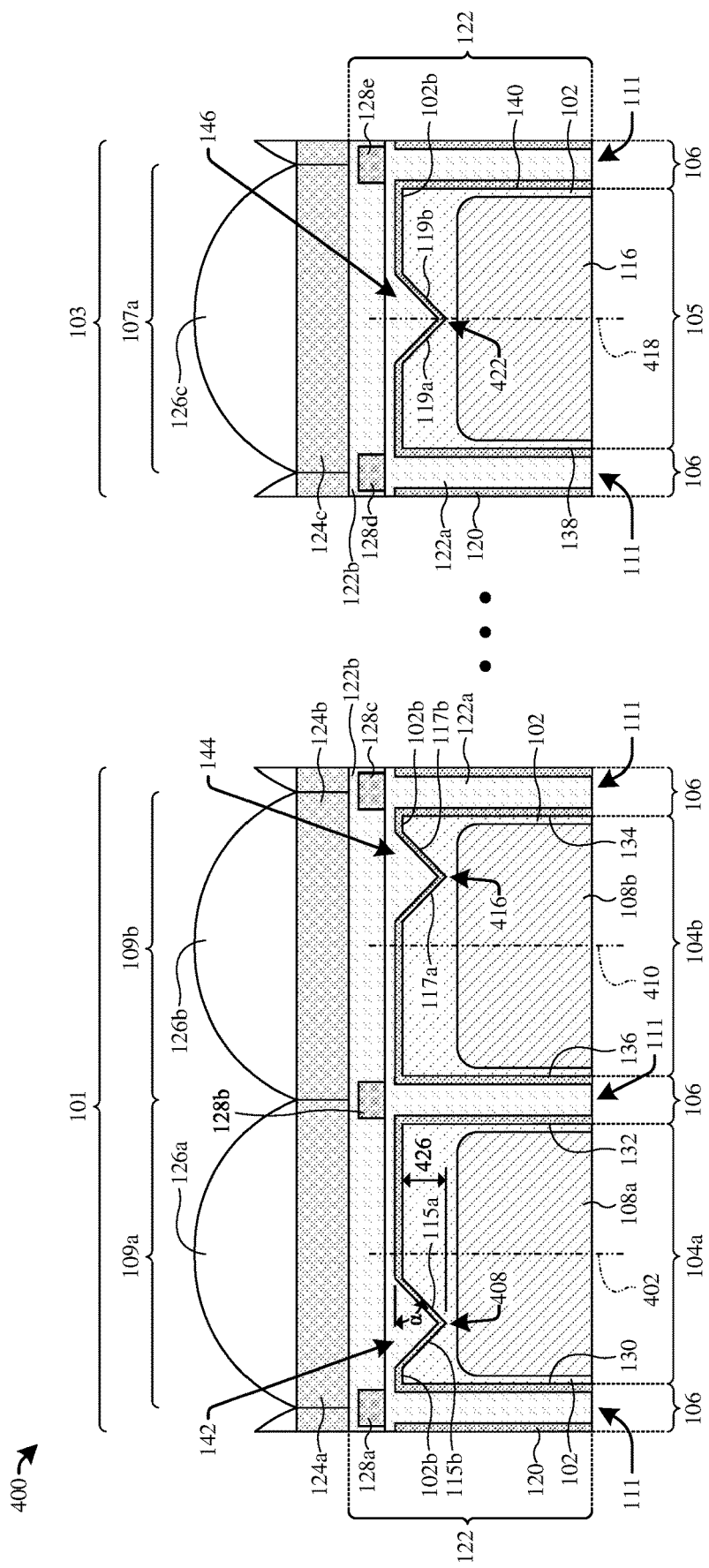
FIGS. 4A-4B illustrate various views of the image sensor of FIG. 2 according to some embodiments.
Figure 4B:
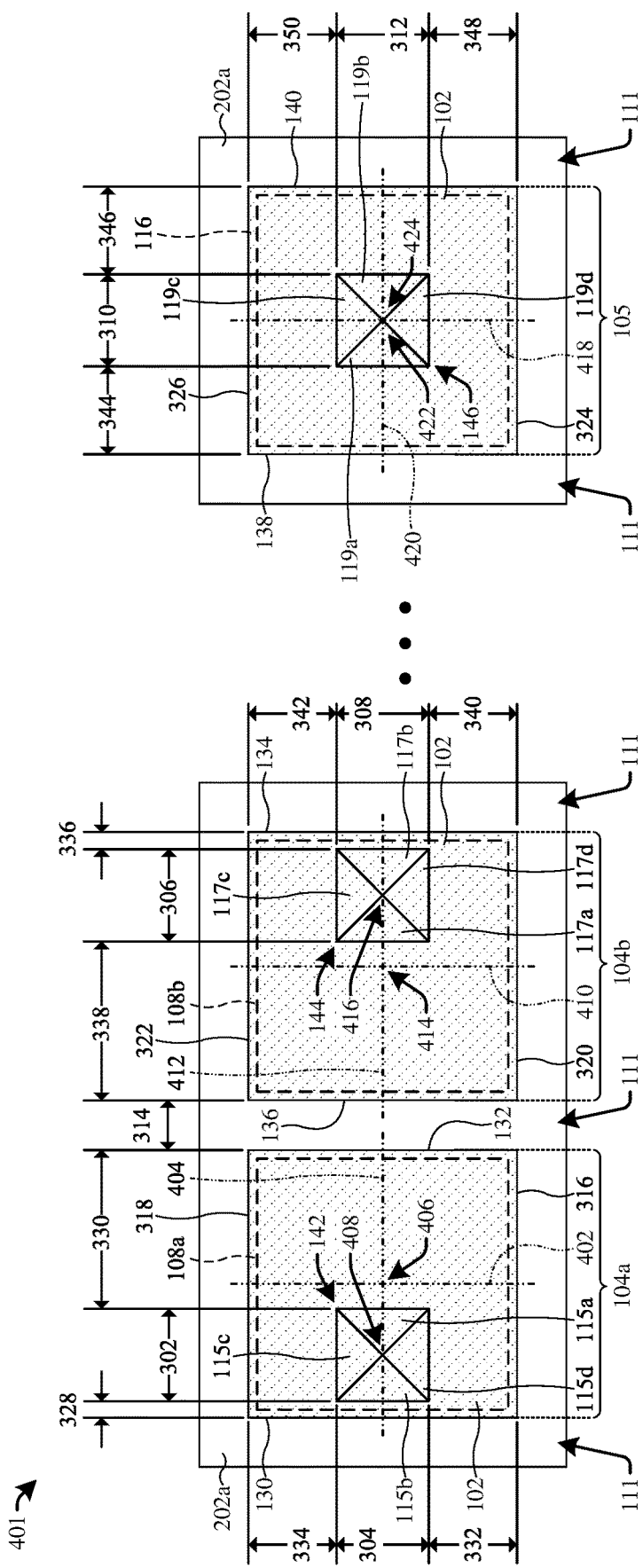

FIGS. 4A-4B illustrate various views of the image sensor 100 of FIG. 2 according to some embodiments. FIG. 4A illustrates a cross-sectional view 400 of some embodiments of an area 206 of the image sensor 100 of FIG. 2. FIG. 4B illustrates a simplified top view 401 of the area 206 of the image sensor 100 of FIG. 2 illustrated in FIG. 4A. The simplified top view 401 of FIG. 4B is "simplified" because the simplified top view 401 of FIG. 4B does not illustrate the anti-reflective layer 120 or the second dielectric structure 122 illustrated in the cross-sectional view 400 of FIG. 4A.

As shown in the cross-sectional view 400 of FIG. 4A and the simplified top view 401 of FIG. 4, the first PDAF pixel region 104a has a first midline 402 and a second midline 404 perpendicular to the first midline 402 of the first PDAF pixel region 104a. The first midline 402 of the first PDAF pixel region 104a is laterally spaced an equal distance from both the first side 130 of the first PDAF pixel region 104a and the second side 132 of the first PDAF pixel region 104a. The second midline 404 of the first PDAF pixel region 104a is laterally spaced an equal distance from both the third side 316 of the first PDAF pixel region 104a and the fourth side 318 of the first PDAF pixel region 104a.

The first midline 402 and the second midline 404 of the first PDAF pixel region 104a intersect at a center point 406 (e.g., centroid) of the first PDAF pixel region 104a. In some embodiments, a center point 408 (e.g., centroid) of the first EMR diffuser 142 is disposed between the first midline 402 of the first PDAF pixel region 104a and the first side 130 of the first PDAF pixel region 104a. In further embodiments, the center point 408 of the first EMR diffuser 142 may be disposed on the second midline 404 of the first PDAF pixel region 104a.

The second PDAF pixel region 104b has a first midline 410 and a second midline 412 perpendicular to the first midline 410 of the second PDAF pixel region 104b. The first midline 410 of the second PDAF pixel region 104b is laterally spaced an equal distance from both the first side 134 of the second PDAF pixel region 104b and the second side 136 of the second PDAF pixel region 104b. The second midline 412 of the second PDAF pixel region 104b is laterally spaced an equal distance from both the third side 320 of the second PDAF pixel region 104b and the fourth side 322 of the second PDAF pixel region 104b. In some embodiments, the first midline 410 of the second PDAF pixel region 104b extends laterally in parallel with the first midline 402 of the first PDAF pixel region 104a. In further embodiments, the second midline 412 of the second PDAF pixel region 104b is substantially aligned with the second midline 404 of the first PDAF pixel region 104a. In other embodiments, the second midline 412 of the second PDAF pixel region 104b is offset from the second midline 404 of the first PDAF pixel region 104a and extends in parallel with the second midline 404 of the first PDAF pixel region 104a.

The first midline 410 and the second midline 412 of the second PDAF pixel region 104b intersect at a center point 414 (e.g., centroid) of the second PDAF pixel region 104b. In some embodiments, a center point 416 (e.g., centroid) of the second EMR diffuser 144 is disposed between the first midline 410 of the second PDAF pixel region 104b and the first side 134 of the second PDAF pixel region 104b. In further embodiments, the center point 416 of the second EMR diffuser 144 is disposed on the second midline 412 of the second PDAF pixel region 104b.

The IS pixel region 105 has a first midline 418 and a second midline 420 perpendicular to the first midline 418 of the IS pixel region 105. The first midline 418 of the IS pixel region 105 is laterally spaced an equal distance from both the first side 138 of the IS pixel region 105 and the second side 140 of the IS pixel region 105. The second midline 420 of the IS pixel region 105 is laterally spaced an equal distance from both the third side 324 of the IS pixel region 105 and the fourth side 326 of the IS pixel region 105.

The first midline 418 and the second midline 420 of the IS pixel region 105 intersect at a center point 422 (e.g., centroid) of the IS pixel region 105. In some embodiments, a center point 424 (e.g., centroid) of the third EMR diffuser 146 is disposed on the center point 422 of the IS pixel region 105. In other embodiments, the center point 424 of the third EMR diffuser 146 may be laterally spaced from the first midline 418 of the IS pixel region 105 and/or the second midline 420 of the IS pixel region 105.

The first EMR diffuser 142 has a height 426 (e.g., a vertical distance between an uppermost point of the first EMR diffuser 142 to a lowermost point of the first EMR diffuser 142). The height 426 of the first EMR diffuser 142 is between about 0.2 um and about 0.9 um. In some embodiments, a height of the second EMR diffuser 144 is substantially the same as the height 426 of the first EMR diffuser 142. In further embodiments, a height of the third EMR diffuser 146 is substantially the same as the height 426 of the first EMR diffuser 142. In other embodiments, the height of the third EMR diffuser 146 is different than the height 426 of the first EMR diffuser 142.

In some embodiments, the height 426 of the first EMR diffuser 142 continuously decreases from the center point 408 of the first EMR diffuser 142 to an outer perimeter of the first EMR diffuser 142. For example, the outer perimeter of the first EMR diffuser 142 is defined by outermost points of the first plurality of PDAF diffusion surfaces 115, and the first plurality of PDAF diffusion surfaces 115 angle (e.g., toward the front-side 102f of the substrate 102) and converge at the center point 408 of the first EMR diffuser 142. In some embodiments, the height of the second EMR diffuser 144 continuously decreases from the center point 416 of the second EMR diffuser 144 to an outer perimeter of the second EMR diffuser 144. In further embodiments, the height of the third EMR diffuser 146 continuously decreases from the center point 422 of the third EMR diffuser 146 to an outer perimeter of the third EMR diffuser 146.

In some embodiments, the first plurality of PDAF diffusion surfaces 115 may form an angle $\alpha$ with respect to the back-side 102b of the substrate 102 (e.g., the planar surface (s) of the back-side 102b of the substrate 102). The angle $\alpha$ may be between about 45° and about 65°. In some embodiments, the angle $\alpha$ is about 54.7°. In such embodiments, the first plurality of PDAF diffusion surfaces 115 are disposed along (111) planes of the substrate 102 and the back-side 102b of the substrate 102 are disposed along the (100) planes of the substrate 102. In some embodiments, the second plurality of PDAF diffusion surfaces 117 may also form the angle $\alpha$ with respect to the back-side 102b of the substrate 102. In further embodiments, the IS diffusion surfaces 119 may also form the angle $\alpha$ with respect to the back-side 102b of the substrate 102.

Figure 5A:
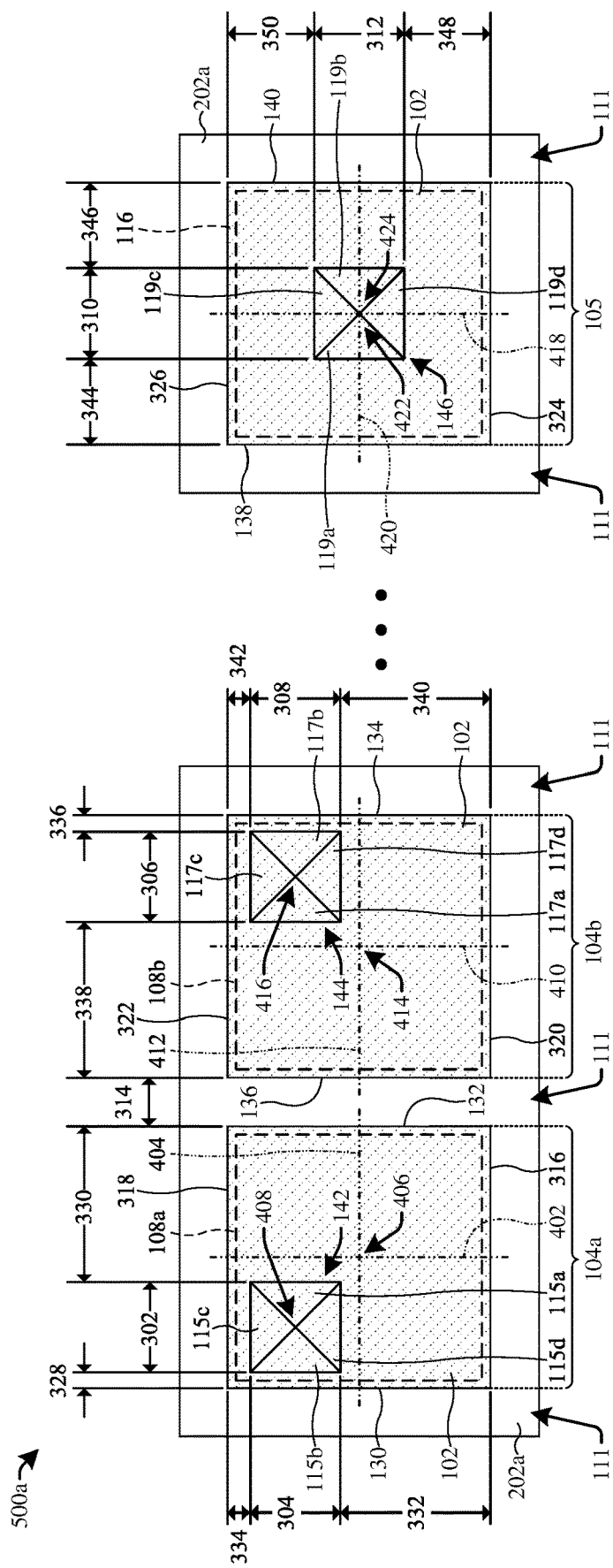
FIGS. 5A-5B illustrate simplified top views of the image sensor of FIG. 2 according to some embodiments.
Figure 5B:
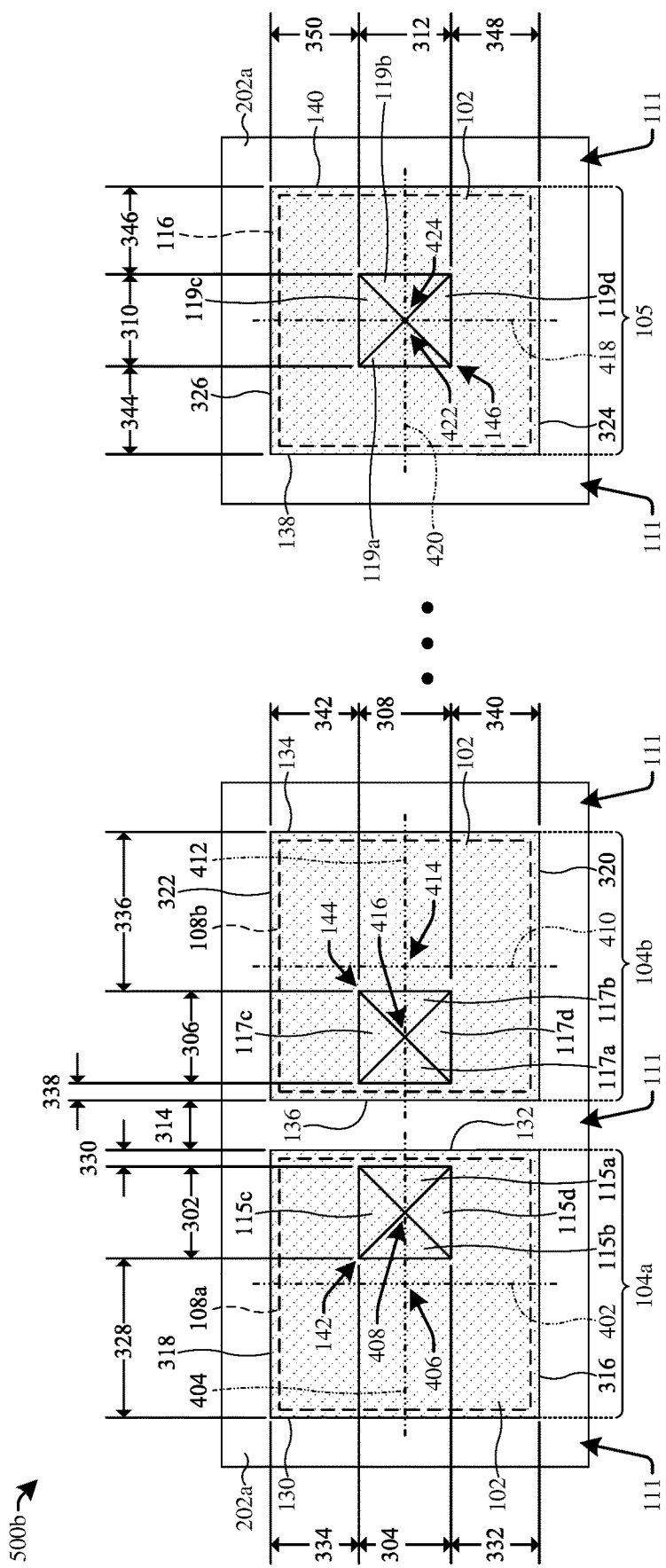

FIGS. 5A-5B illustrate simplified top views 500 of the image sensor 100 of FIG. 2 according to some embodiments. The simplified top views 500 of FIGS. 5A-5B are "simplified" because the simplified top views 500 of FIGS. 5A-5B do not illustrate the anti-reflective layer 120 or the second dielectric structure 122 illustrated in the cross-sectional view 200 of FIG. 2. The simplified top views 500 of FIGS. 5A-5B illustrate various embodiments in which the first PDAF pixel region 104a and the second PDAF pixel region 104b are symmetrical. For example, the simplified top view 500a of FIG. 5A and the simplified top view 500b of FIG. 5B illustrate some different embodiments in which the first PDAF pixel region 104a and the second PDAF pixel region 104b are symmetrical (see, e.g., FIG. 3).

As shown in the simplified top view 500a of FIG. 5A, the center point 408 of the first EMR diffuser 142 is disposed between the first midline 402 of the first PDAF pixel region 104a and the first side 130 of the first PDAF pixel region 104a and between the second midline 404 of the first PDAF pixel region 104a and the fourth side 318 of the first PDAF pixel region 104a. In such embodiments, the fifth distance 334 is less than the fourth distance 332. The center point 416 of the second EMR diffuser 144 is disposed between the first midline 410 of the second PDAF pixel region 104b and the first side 134 of the second PDAF pixel region 104b and between the second midline 412 of the second PDAF pixel region 104b and the fourth side 322 of the second PDAF pixel region 104b. In such embodiments, the ninth distance 342 is less than the eighth distance 340.

It will be appreciated that, in other embodiments in which the center point 408 of the first EMR diffuser 142 is disposed between the first midline 402 of the first PDAF pixel region 104a and the first side 130 of the first PDAF pixel region 104a, the center point 408 of the first EMR diffuser 142 may be disposed between the second midline 404 of the first PDAF pixel region 104a and the third side 316 of the first PDAF pixel region 104a. In such embodiments, the center point 416 of the second EMR diffuser 144 is disposed between the first midline 410 of the second PDAF pixel region 104b and the first side 134 of the second PDAF pixel region 104b and between the second midline 412 of the second PDAF pixel region 104b and the third side 320 of the second PDAF pixel region 104b. In further such embodiments, the fifth distance 334 is greater than the fourth distance 332, and the ninth distance 342 is greater than the eighth distance 340.

As shown in the simplified top view 500b of FIG. 5B, the center point 408 of the first EMR diffuser 142 is disposed between the first midline 402 of the first PDAF pixel region 104a and the second side 132 of the first PDAF pixel region 104a and disposed on the second midline 404 of the first PDAF pixel region 104a. In such embodiments, the second distance 328 is greater than the third distance 330. The center point 416 of the second EMR diffuser 144 is disposed between the first midline 410 of the second PDAF pixel region 104b and the second side 136 of the second PDAF pixel region 104b and disposed on the second midline 412 of the second PDAF pixel region 104b. In such embodiments, the sixth distance 336 is greater than the seventh distance 338.

It will be appreciated that, in other embodiments in which the center point 408 of the first EMR diffuser 142 is disposed between the first midline 402 of the first PDAF pixel region 104a and the second side 132 of the first PDAF pixel region 104a, the center point 408 of the first EMR diffuser 142 may be disposed between the second midline 404 of the first PDAF pixel region 104a and the fourth side 318 of the first PDAF pixel region 104a (see, FIG. 5A). In such embodiments, the center point 416 of the second EMR diffuser 144 is disposed between the first midline 410 of the second PDAF pixel region 104b and the second side 136 of the second PDAF pixel region 104b and between the second midline 412 of the second PDAF pixel region 104b and the fourth side 322 of the second PDAF pixel region 104b (see, FIG. 5A). It will further be appreciated that, in other embodiments in which the center point 408 of the first EMR diffuser 142 is disposed between the first midline 402 of the first PDAF pixel region 104a and the second side 132 of the first PDAF pixel region 104a, the center point 408 of the first EMR diffuser 142 may be disposed between the second midline 404 of the first PDAF pixel region 104a and the third side 316 of the first PDAF pixel region 104a. In such embodiments, the center point 416 of the second EMR diffuser 144 is disposed between the first midline 410 of the second PDAF pixel region 104b and the second side 136 of the second PDAF pixel region 104b and between the second midline 412 of the second PDAF pixel region 104b and the third side 320 of the second PDAF pixel region 104b.

Figure 6:
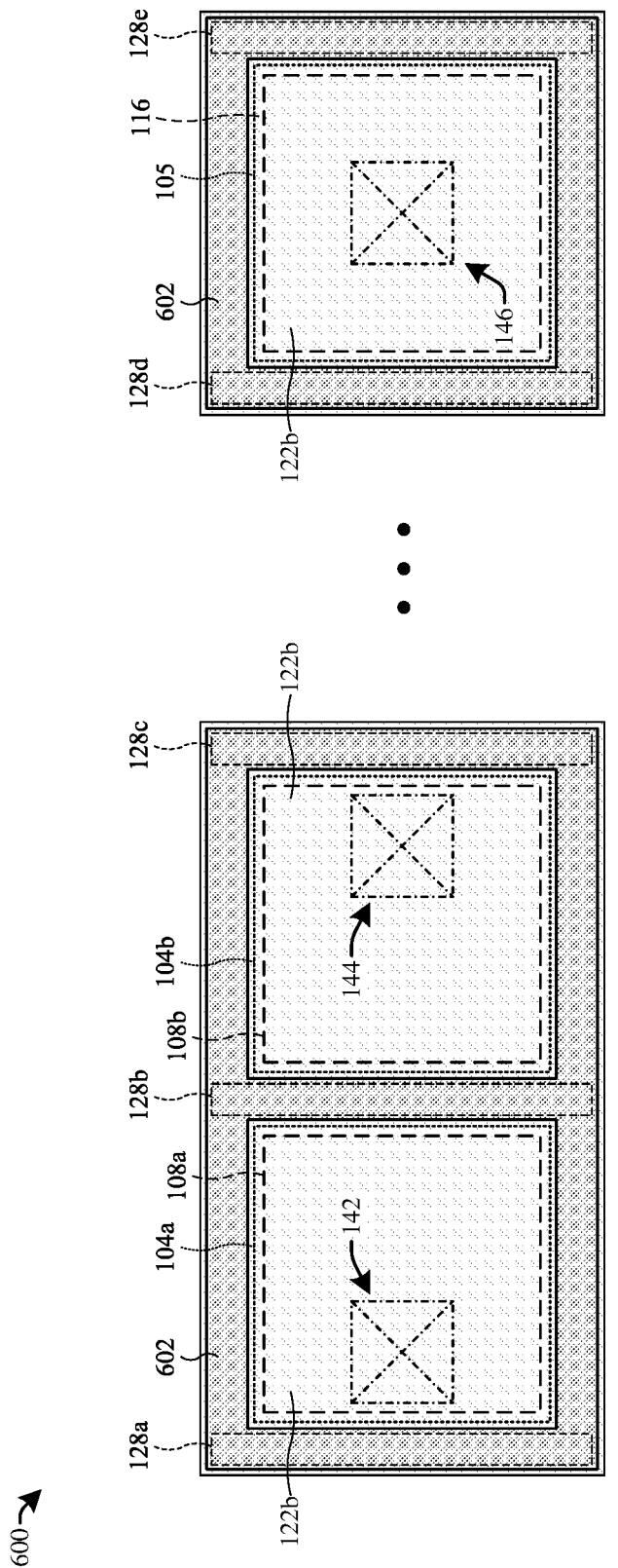
FIG. 6 illustrates a top view of the image sensor of FIG. 2 according to some embodiments.

FIG. 6 illustrates a top view 600 of the image sensor 100 of FIG. 2 according to some embodiments.

As shown in the top view 600 of FIG. 6, in some embodiments, the EMR shields 128 are portions of an EMR shield grid 602 (e.g., metal grid) that is disposed in (e.g., embedded in) the second dielectric structure 122. The EMR shield grid 602 extends laterally through the second dielectric structure 122, such that the EMR shield grid 602 is disposed outside (e.g., completely outside) the PDAF pixel regions 104 (and the IS pixel region 105). The EMR shield grid 602 is disposed vertically between the EMR filters 124 and the back-side 102b of the substrate 102 (see, FIG. 2). The EMR shield grid 602 is configured to block (e.g., reflect) some of the incident EMR. More specifically, the EMR shield grid 602 reduces cross-talk between adjacent pixel regions (e.g., the PDAF pixel regions 104 and/or the IS pixel region 105) by blocking (e.g., reflecting) the lateral propagation of the incident EMR. The EMR shield grid 602 may comprise a metal (e.g., Al, Co, Cu, Ag, Au, W, etc.) and/or a dielectric material (e.g., $SiO_2$, SiN, etc.).

Figure 7A:
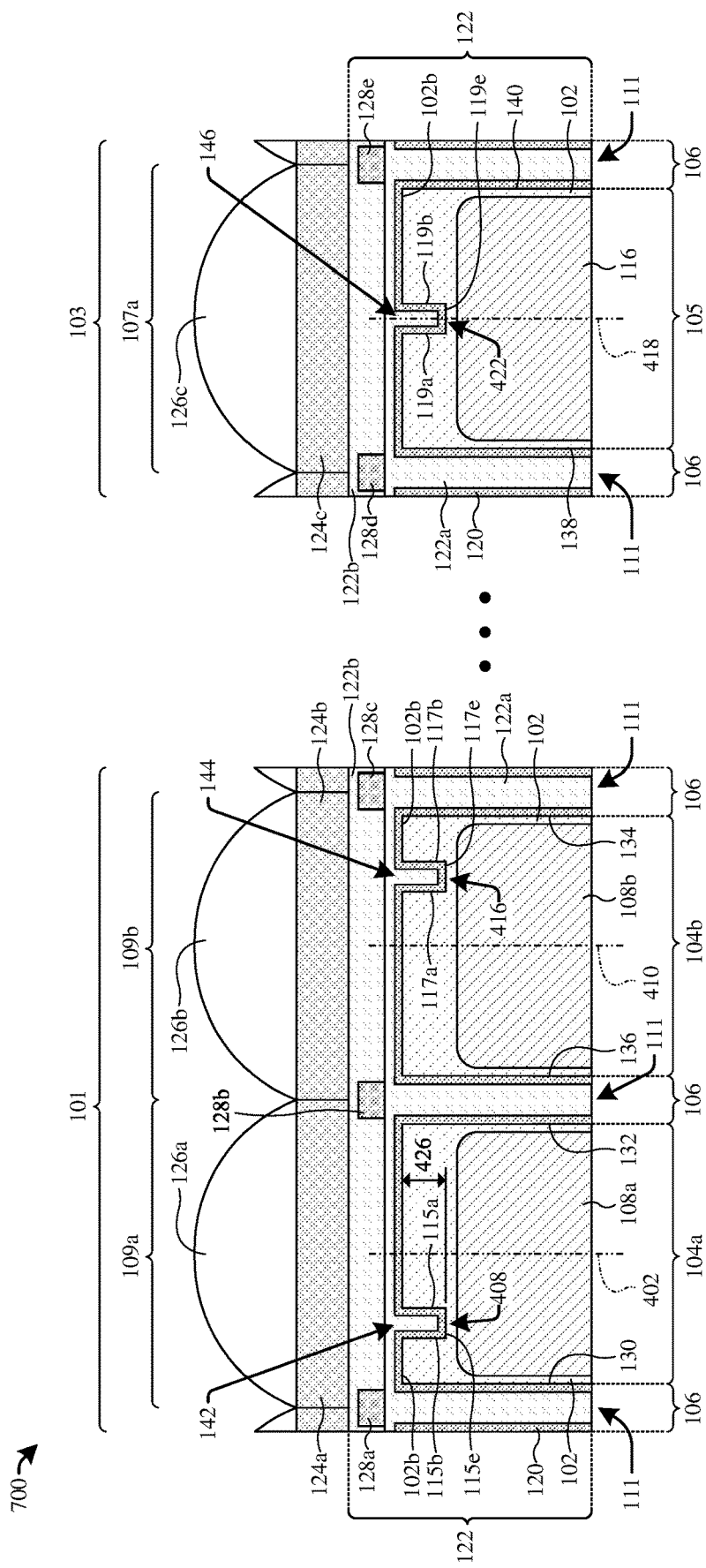
FIGS. 7A-7B illustrate various views of the image sensor of FIG. 2 according to some embodiments.
Figure 7B:
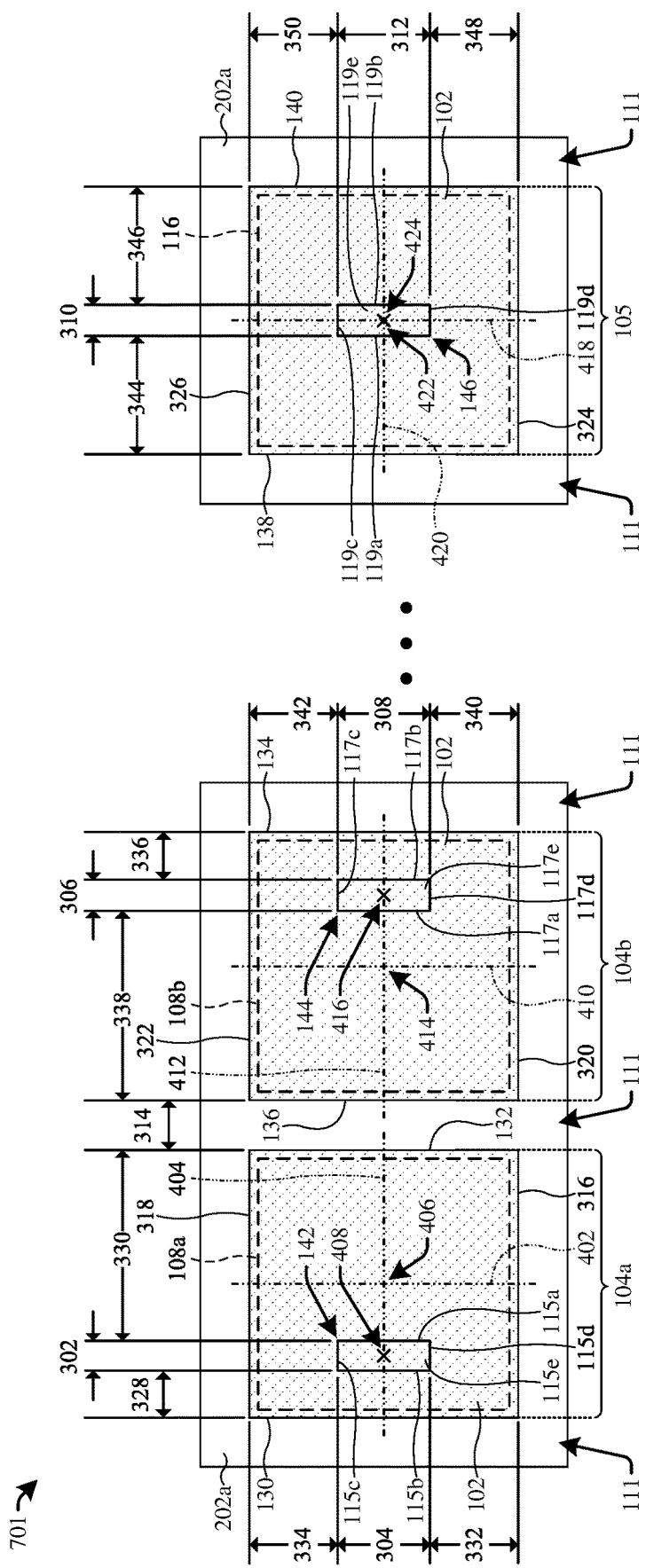

FIGS. 7A-7B illustrate various views of the image sensor 100 of FIG. 2 according to some embodiments. FIG. 7A illustrates a cross-sectional view 700 of some embodiments of the area 206 of the image sensor 100 of FIG. 2. FIG. 7B illustrates a simplified top view 701 of the area 206 of the image sensor 100 of FIG. 2 illustrated in FIG. 7A. The simplified top view 701 of FIG. 7B is "simplified" because the simplified top view 701 of FIG. 7B does not illustrate the anti-reflective layer 120 or the second dielectric structure 122 illustrated in the cross-sectional view 700 of FIG. 7A. In the simplified top view 701 of FIG. 7B, the center point 408 of the first EMR diffuser 142, the center point 416 of the second EMR diffuser 144, and the center point 424 of the third EMR diffuser 146 are denoted by "X" marks, respectively.

As shown in in the cross-sectional view 700 of FIG. 7A and the simplified top view 701 of FIG. 7B, the first EMR diffuser 142 may have a cuboid-like shape (e.g., a rectangular cuboid, a cube, or the like). In such embodiments, the first plurality of PDAF diffusion surfaces 115 comprises the first PDAF diffusion surface 115a, the second PDAF diffusion surface 115b, the fifth PDAF diffusion surface 115c, the sixth PDAF diffusion surface 115d, and a ninth PDAF diffusion surface 115e. In some embodiments, the ninth PDAF diffusion surface 115e is substantially planar (e.g., flat). In further embodiments, the first PDAF diffusion surface 115a, the second PDAF diffusion surface 115b, the fifth PDAF diffusion surface 115c, and the sixth PDAF diffusion surface 115d are substantially vertical (e.g., extend from the ninth PDAF diffusion surface 115e at angles that are equal to about 90°). In other embodiments, the first PDAF diffusion surface 115a, the second PDAF diffusion surface 115b, the fifth PDAF diffusion surface 115c, and the sixth PDAF diffusion surface 115d may be angled (e.g., extend from the ninth PDAF diffusion surface 115e at angles that are less than or greater than about 90°).

The second EMR diffuser 144 may also have a cuboid-like shape (e.g., a rectangular cuboid, a cube, or the like). In such embodiments, the second plurality of PDAF diffusion surfaces 117 comprises the third PDAF diffusion surface 117a, the fourth PDAF diffusion surface 117b, the seventh PDAF diffusion surface 117c, the eighth PDAF diffusion surface 117d, and a tenth PDAF diffusion surface 117e. In some embodiments, the tenth PDAF diffusion surface 117e is substantially planar (e.g., flat). In further embodiments, the third PDAF diffusion surface 117a, the fourth PDAF diffusion surface 117b, the seventh PDAF diffusion surface 117c, and the eighth PDAF diffusion surface 117d are substantially vertical (e.g., extend from the tenth PDAF diffusion surface 117e at angles that are equal to about 90°). In other embodiments, the third PDAF diffusion surface 117a, the fourth PDAF diffusion surface 117b, the seventh PDAF diffusion surface 117c, and the eighth PDAF diffusion surface 117d may be angled (e.g., extend from the tenth PDAF diffusion surface 117e at angles that are less than or greater than about) 90°.

The third EMR diffuser 146 may also have a cuboid-like shape (e.g., a rectangular cuboid, a cube, or the like). In such embodiments, the plurality of IS diffusion surfaces 119 comprises the first IS diffusion surface 119a, the second IS diffusion surface 119b, the third IS diffusion surface 119c, the fourth IS diffusion surface 119d, and a fifth IS diffusion surface 119e. In some embodiments, the fifth IS diffusion surface 119e is substantially planar (e.g., flat). In further embodiments, the first IS diffusion surface 119a, the second IS diffusion surface 119b, the third IS diffusion surface 119c, and the fourth IS diffusion surface 119d are substantially vertical (e.g., extend from the fifth IS diffusion surface 119e at angles that are equal to about) 90°. In other embodiments, the first IS diffusion surface 119a, the second IS diffusion surface 119b, the third IS diffusion surface 119c, and the fourth IS diffusion surface 119d may be angled (e.g., extend from the fifth IS diffusion surface 119e at angles that are less than or greater than about 90°).

In some embodiments, the shape of the second EMR diffuser 144 (e.g., rectangular cuboid-like) is substantially the same as the shape of the first EMR diffuser 142 (e.g., rectangular cuboid-like). In further embodiments, the shape of the third EMR diffuser 146 (e.g., rectangular cuboid-like) is substantially the same as the shape of the second EMR diffuser 144 and/or the first EMR diffuser 142. In other embodiments, the shape of the third EMR diffuser 146 (e.g., inverted pyramid-like) may be different than the shape of the second EMR diffuser 144 (e.g., rectangular cuboid-like) and/or the first EMR diffuser 142 (e.g., rectangular cuboid-like). It will be appreciated that the shape of the first EMR diffuser 142, the shape of the second EMR diffuser 144, and the shaped of the third EMR diffuser 146 may be any geometrical shape that is capable of diffusing the incident EMR (e.g., NIR radiation), such as a conical-like shape, a hemispherical-like shape, a prism-like shape, or the like.

Figure 8:
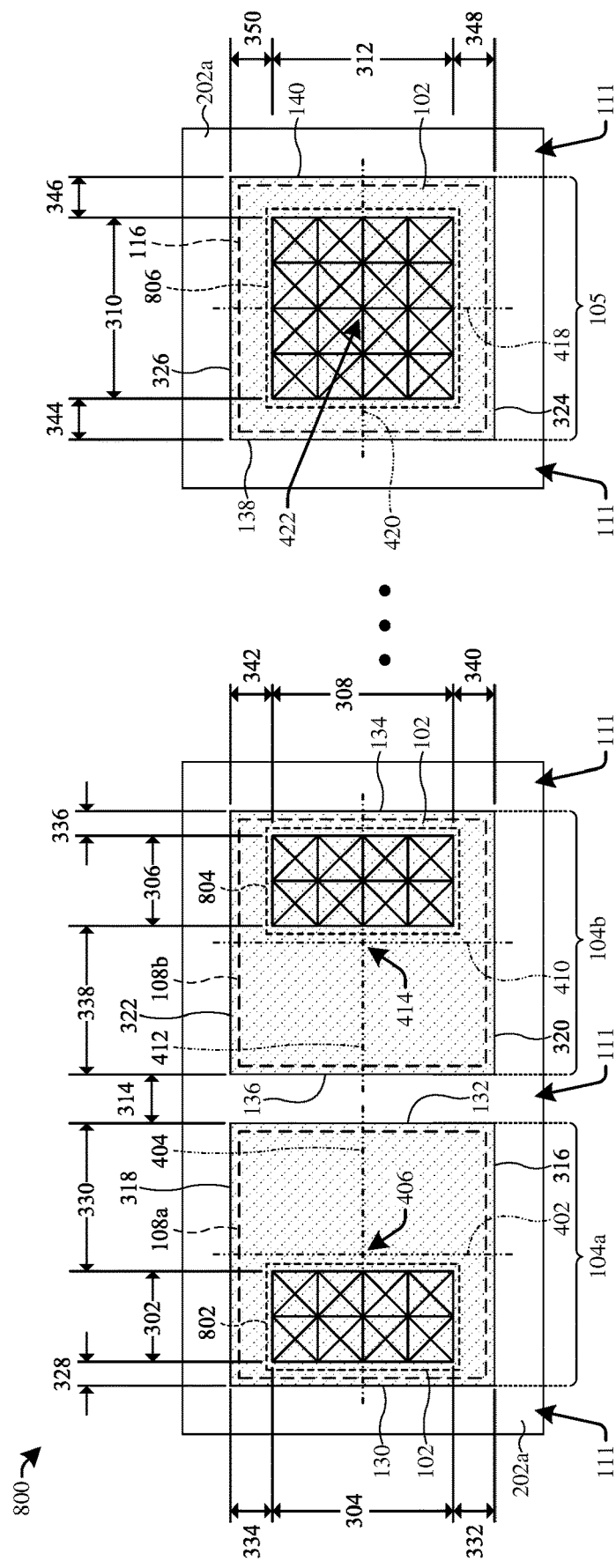
FIG. 8 illustrates a simplified top view of the image sensor of FIG. 2 according to some embodiments.

FIG. 8 illustrates a simplified top view 800 of the image sensor 100 of FIG. 2 according to some embodiments. The simplified top view 800 of FIG. 8 is "simplified" because the simplified top view 800 of FIG. 8 does not illustrate the anti-reflective layer 120 or the second dielectric structure 122 illustrated in the cross-sectional view 200 of FIG. 2.

As shown in the simplified top view 800 of FIG. 8, a first array 802 of EMR diffusers is disposed along the back-side 102*b* of the substrate 102 and within the first PDAF pixel region 104*a*. The first array 802 of EMR diffusers may comprise any number of individual EMR diffusers disposed in any combination of rows and columns (e.g., a 1×2 array, a 2×2 array, a 3×1 array, a 3×2 array, a 4×2 array, etc.). The individual EMR diffusers of the first array 802 of EMR diffusers have substantially similar features (e.g., structural features) as the first EMR diffuser 142 (see, e.g., FIGS. 1-9). The first array 802 of EMR diffusers may be arranged in the first PDAF pixel region 104*a* in a substantially similar manner as the first EMR diffuser 142. For example, the first array 802 of EMR diffusers may be spaced the second distance 328 from the first side 130 of the first PDAF pixel region 104*a*, the third distance 330 from the second side 132 of the first PDAF pixel region 104*a*, and so forth.

A second array 804 of EMR diffusers is disposed along the back-side 102*b* of the substrate 102 and within the second PDAF pixel region 104*b*. The second array 804 of EMR diffusers may comprise any number of individual EMR diffusers disposed in any combination of rows and columns (e.g., a 1×2 array, a 2×2 array, a 3×1 array, a 3×2 array, a 4×2 array, etc.). The individual EMR diffusers of the second array 804 of EMR diffusers have substantially similar features (e.g., structural features) as the second EMR diffuser 144 (see, e.g., FIGS. 1-9). The second array 804 of EMR diffusers may be arranged in the second PDAF pixel region 104*b* in a substantially similar manner as the second EMR diffuser 144. For example, the second array 804 of EMR diffusers may be spaced the sixth distance 336 from the first side 134 of the second PDAF pixel region 104*b*, the seventh distance 338 from the second side 136 of the second PDAF pixel region 104*b*, and so forth.

A third array 806 of EMR diffusers is disposed along the back-side 102*b* of the substrate 102 and within the IS pixel region 105. The third array 806 of EMR diffusers may comprise any number of individual EMR diffusers disposed in any combination of rows and columns (e.g., a 1×2 array, a 2×2 array, a 3×1 array, a 3×2 array, a 4×2 array, etc.). The individual EMR diffusers of the third array 806 of EMR diffusers have substantially similar features (e.g., structural features) as the third EMR diffuser 146 (see, e.g., FIGS. 1-9). The third array 806 of EMR diffusers may be arranged in the IS pixel region 105 in a substantially similar manner as the third EMR diffuser 146. For example, the third array 806 of EMR diffusers may be spaced the tenth distance 344 from the first side 138 of the IS pixel region 105, the eleventh distance 346 from the second side 140 of the IS pixel region 105, and so forth.

In some embodiments, the first array 802 of EMR diffusers comprises a same number of individual EMR diffusers as the second array 804 of EMR diffusers. For example, as shown in the simplified top view 800 of FIG. 8, the first array 802 of EMR diffusers comprises eight individual EMR diffusers, and the second array 804 of EMR diffusers also comprises eight individual EMR diffusers. In further embodiments, the number of rows and columns of the first array 802 of EMR diffusers is the same as the number of rows and columns as the second array 804 of EMR diffusers. For example, as shown in the simplified top view 800 of FIG. 8, the first array 802 of EMR diffusers comprises two columns and four rows, and the second array 804 of EMR diffusers also comprises two columns and four rows.

In some embodiments, the third array 806 of EMR diffusers may comprises a different number of individual EMR diffusers than the first array 802 of EMR diffusers and/or the second array 804 of EMR diffusers. For example, as shown in the simplified top view 800 of FIG. 8, the third array 806 of EMR diffusers comprise sixteen individual EMR diffusers, the first array 802 of EMR diffusers comprises eight individual EMR diffusers, and the second array 804 of EMR diffusers comprises eight individual EMR diffusers. In other embodiments, the third array 806 of EMR diffusers may comprises a same number of individual EMR diffusers as the first array 802 of EMR diffusers and/or the second array 804 of EMR diffusers. In further embodiments, the number of rows and columns of the third array 806 of EMR diffusers may be different than the number of rows and columns of the first array 802 of EMR diffusers and/or the number of rows and columns of the second array 804 of EMR diffusers. For example, as shown in the simplified top view 800 of FIG. 8, the third array 806 of EMR diffusers comprises four rows and four columns, the first array 802 of EMR diffusers comprises two columns and four rows, and the second array 804 of EMR diffusers also comprises two columns and four rows. In other embodiments, the number of rows and columns of the third array 806 of EMR diffusers may be the same as the number of rows and columns of the first array 802 of EMR diffusers and/or the number of rows and columns of the second array 804 of EMR diffusers.

FIGS. 9-18 illustrate a series of cross-sectional views 900-1800 of some embodiments of a method for forming the image sensor 100 of FIG. 2. Although FIGS. 9-18 are described with reference to a method, it will be appreciated that the structures shown in FIGS. 9-18 are not limited to the method but rather may stand alone separate of the method.

Figure 9:
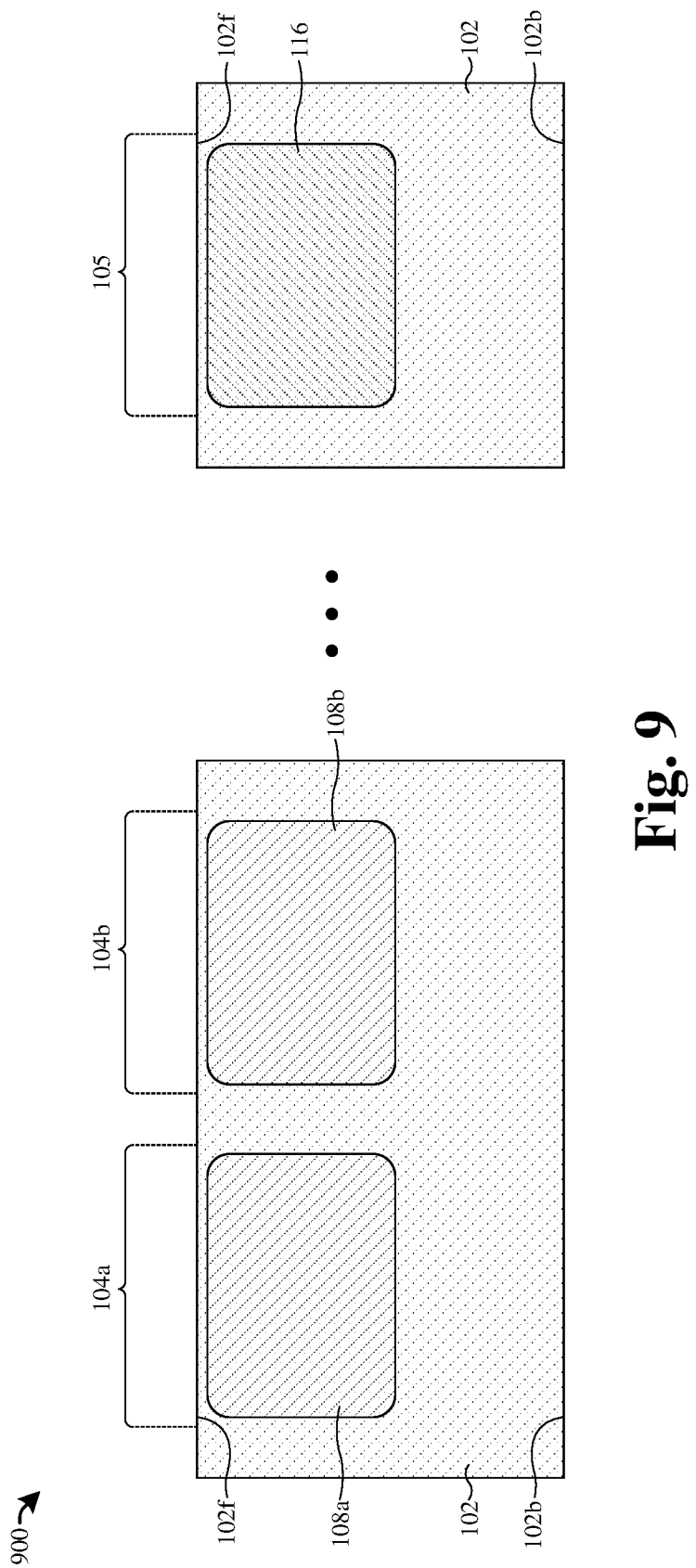
FIGS. 9-18 illustrate a series of cross-sectional views of some embodiments of a method for forming the image sensor of FIG. 2.

As shown in cross-sectional view 900 of FIG. 9, a substrate 102 is provided. The substrate 102 comprises a front-side 102*f* and a back-side 102*b*. The substrate 102 may be any type of semiconductor body (e.g., Si, SiGe, SOI, etc.), such as a semiconductor wafer and/or one or more die on a wafer, as well as any other type of semiconductor and/or epitaxial layers, associated therewith.

PDAF photodetectors 108 (e.g., photodiodes) are formed in the substrate 102. The PDAF photodetectors 108 are formed in PDAF pixel regions 104 of the substrate 102, respectively. For example, a first PDAF photodetector 108*a* is formed in a first PDAF pixel region 104*a* of the substrate 102, and a second PDAF photodetector 108*b* is formed in a second PDAF pixel region 104*b* of the substrate 102. An IS photodetector 116 (e.g., photodiode) is also formed in the substrate 102. The IS photodetector 116 is formed in an IS pixel region 105 of the substrate 102.

In some embodiments, a process for forming the PDAF photodetectors 108 and the IS photodetector 116 comprises selectively implanting one or more dopant species (e.g., p-type dopants, such as boron, aluminum, gallium, or the like) into the front-side 102*f* of the substrate 102. For example, a patterned masking layer (not shown) (e.g., positive/negative photoresist, a hardmask, etc.) is formed on the front-side 102*f* of the substrate 102. The patterned masking layer may be formed by forming a masking layer (not shown) on the front-side 102*f* of the substrate 102 (e.g., via a spin-on process), exposing the masking layer to a pattern (e.g., via a lithography process, such as photolithography, extreme ultraviolet lithography, or the like), and developing the masking layer to form the first patterned masking layer. Thereafter, with the patterned masking layer in place, an implantation process (e.g., ion implantation) is performed that implants the one or more doping species into the substrate 102 according to the patterned masking layer, thereby forming doped regions having a second doping type (e.g., p-type) in the substrate 102 that correspond to the PDAF photodetectors 108 and the IS photodetector 116. In some embodiments, a second implantation process may be performed before the first implantation process to form doped regions having a first doping type (e.g., n-type) different than the second doping type in the substrate 102, such that the first implantation process forms the doped regions having the second doping type in the doped regions having the first doping type. In some embodiments, the patterned masking layer is subsequently stripped away.

Figure 10:
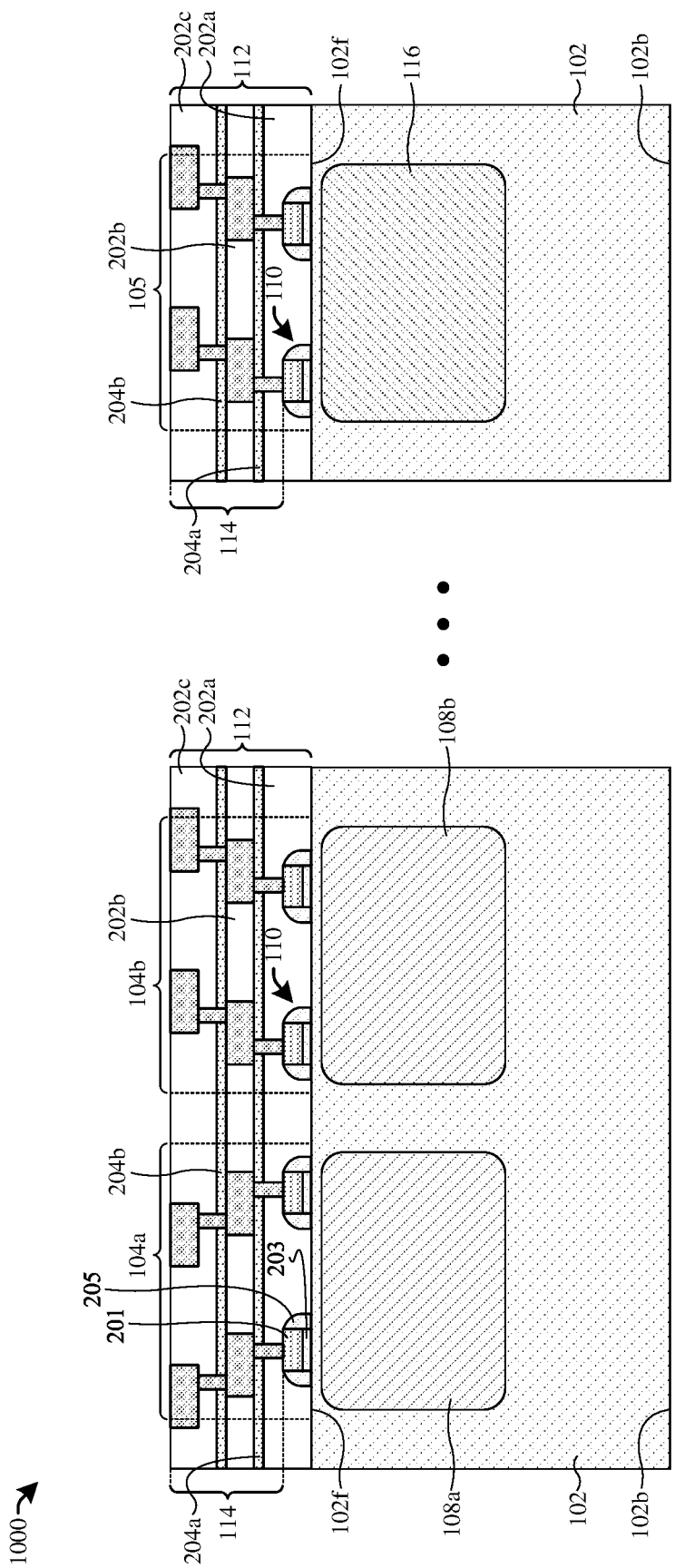

As shown in cross-sectional view 1000 of FIG. 10, one or more gate structures 110 are formed along the front-side 102f of the substrate 102. In some embodiments, the one or more gate structures 110 may correspond to a transfer transistor, a source-follower transistor, a row select transistor, a reset transistor, a logic gate transistor (e.g., a transistor of a OR gate, a XOR gate, etc.), or some other transistor. In some embodiments, the one or more gate structures 110 may be formed by depositing a gate dielectric layer and a gate electrode layer on the front-side 102f of the substrate 102. The gate dielectric layer and the gate electrode layer are subsequently patterned to form a gate dielectric structure 203 and a conductive gate electrode structure 201 overlying the gate dielectric structure 203. A sidewall spacer 205 may be formed along opposite sidewalls of the conductive gate electrode structure 201. In some embodiments, the sidewall spacer 205 may be formed by depositing a spacer layer (e.g., a nitride, an oxide, etc.) onto the front-side 102f of the substrate 102 and selectively etching the spacer layer to form the sidewall spacer 205 along the opposite sides of the conductive gate electrode structure 201.

Also shown in the cross-sectional view 1000 of FIG. 10, a plurality of conductive interconnect layers 114 are formed within a first dielectric structure 112 formed along the front-side 102f of the substrate 102. In some embodiments, the first dielectric structure 112 may comprise a plurality of stacked ILD layers 202 vertically separated from one another by etch stop layers 204.

In some embodiments, the plurality of conductive interconnect layers 114 may be respectively formed by a damascene process (e.g., a single damascene process or a dual damascene process). The damascene process is performed by depositing one of the plurality of stacked ILD layers 202 on the substrate 102, etching the one of the plurality of stacked ILD layers 202 to form a via hole and/or a trench in the one of the plurality of stacked ILD layers 202, and filling the via hole and/or trench with a conductive material. Thereafter, a planarization process (e.g., chemical mechanical polishing (CMP)) is performed on the conductive material, thereby forming conductive interconnect layers in the one of the plurality of stacked ILD layers 202. In some embodiments, the damascene process comprises depositing one of the etch stop layers 204 on the one of the plurality of stacked ILD layers 202 and etching the one of the etch stop layers 204 to form the via hole. This process is repeated to form the plurality of stacked ILD layers 202, the etch stop layers 204, and the plurality of conductive interconnect layers 114.

In some embodiments, the plurality of stacked ILD layers 202 may be deposited by, for example, chemical vapor deposition (CVD), physical vapor deposition (PVD), atomic layer deposition (ALD), some other deposition process, or a combination of the foregoing. In further embodiments, the etch stop layers 204 may be deposited by, for example, CVD, PVD, ALD, some other deposition process, or a combination of the foregoing. In yet further embodiments, the conductive material (e.g., tungsten (W), aluminum (Al), copper (Cu), or the like) may be formed using a deposition process (e.g., CVD, PVD, sputtering, etc.) and/or a plating process (e.g., electrochemical plating, electroless plating, etc.).

Figure 11:
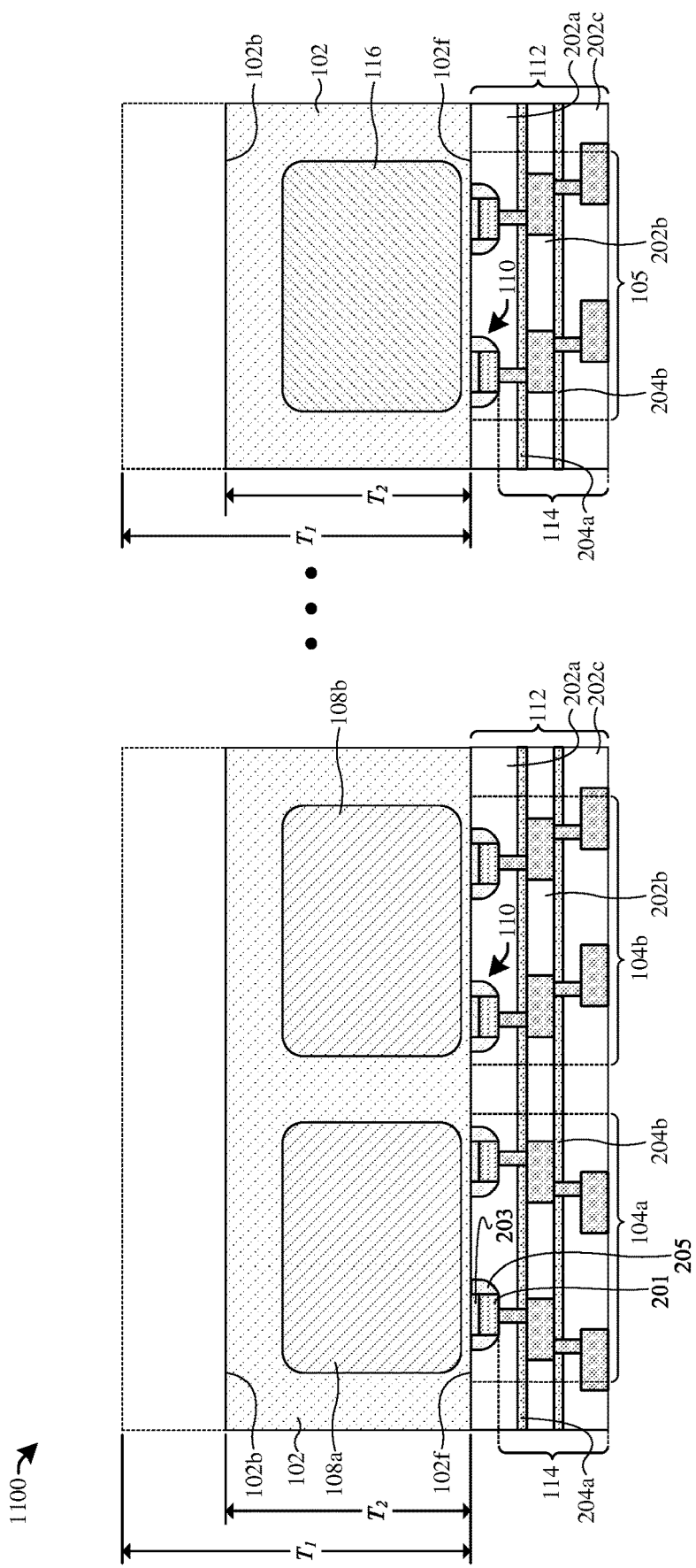

As shown in cross-sectional view 1100 of FIG. 11, in some embodiments, the substrate 102 may be thinned to reduce a thickness of the substrate 102. In further embodiments, the substrate 102 may be thinned by performing a thinning process on the back-side 102b of the substrate 102 to reduce the thickness of the substrate 102 from a first thickness $T_1$ to a second thickness $T_2$. In further embodiments, the thinning process may be or comprise, for example, a CMP process, a mechanical grinding process, an etching process, some other thinning process, or a combination of the foregoing. It will be appreciated that, in some embodiments, the first dielectric structure 112 may be bonded to a carrier substrate (not shown) before the thinning process so that the substrate 102 can be safely handled during the thinning process.

Figure 12:
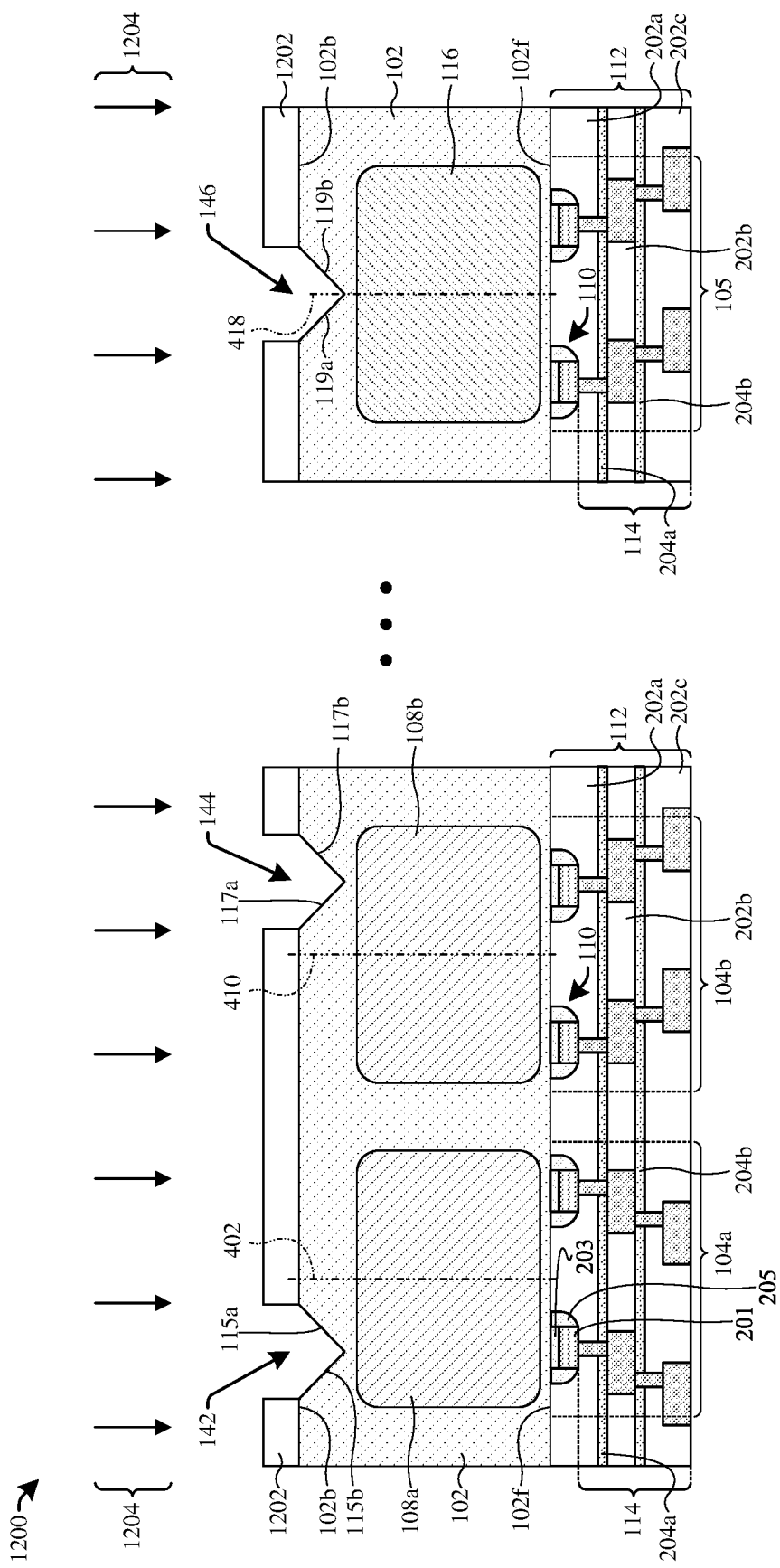

As shown in cross-sectional view 1200 of FIG. 12, a first EMR diffuser 142, a second EMR diffuser 144, and a third EMR diffuser 146 are formed along the back-side 102b of the substrate 102. The first EMR diffuser 142 is formed within the first PDAF pixel region 104a, the second EMR diffuser 144 is formed within the second PDAF pixel region 104b, and the third EMR diffuser 146 is formed with the IS pixel region 105. The first EMR diffuser 142 is formed on a first side of a first midline 402 of the first PDAF pixel region 104a, and the second EMR diffuser 144 is formed on a first side of a first midline 410 of the second PDAF pixel region 104b. In some embodiments, the third EMR diffuser 146 may be formed on (e.g., directly on) a first midline 418 of the IS pixel region 105.

In comparison to the side of the first midline 402 of the first PDAF pixel region 104a in which the first side of the first midline 402 of the first PDAF pixel region 104a corresponds, the first side of the first midline 410 of the second PDAF pixel region 104b corresponds to an opposite side of the first midline 410 of the second PDAF pixel region 104b. For example, as shown in the cross-sectional view 1200 of FIG. 12, the first side of the first midline 402 of the first PDAF pixel region 104a corresponds to a left side of the first midline 402 of the first PDAF pixel region 104a and the first side of the first midline 410 of the second PDAF pixel region 104b corresponds to a right side of the first midline 410 of the second PDAF pixel region 104b. In some embodiments, the first EMR diffuser 142 may also be formed on (e.g., directly on) a second midline 404 (see, e.g., FIG. 3) of the first PDAF pixel region 104a. In such embodiments, the second EMR diffuser 144 may also be formed on (e.g., directly on) a second midline 412 (see, e.g., FIG. 3) of the second PDAF pixel region 104b. In other embodiments, the first EMR diffuser 142 may also be formed on a first side of the second midline 404 of the first PDAF pixel region 104a. In such embodiments, the second EMR diffuser 144 may also be formed on a first side of the second midline 412 of the second PDAF pixel region 104b, which corresponds to a same side of the second midline 412 of the second PDAF pixel region 104b as the first side of the first side of the second midline 404 of the first PDAF pixel region 104a corresponds (see, e.g., FIG. 5A).

In some embodiments, a process for forming the first EMR diffuser 142, the second EMR diffuser 144, and the third EMR diffuser 146 comprises selectively etching the back-side 102b of the substrate 102. For example, a patterned masking layer 1202 (e.g., positive/negative photoresist, a hardmask, etc.) is formed over the back-side 102b of the substrate 102. Thereafter, with the patterned masking layer 1202 in place, an etching process 1204 is performed on the substrate 102 to selectively etch the back-side 102b of the substrate 102 according to the patterned masking layer 1202. The etching process 1204 removes unmasked portions of the substrate 102 to form a first plurality of PDAF diffusion surfaces 115 that define the first EMR diffuser 142, a second plurality of PDAF diffusion surfaces 117 that define the second EMR diffuser 144, and a plurality of IS diffusion surfaces 119 that define the third EMR diffuser 146. In some embodiments, the patterned masking layer 1202 is subsequently stripped away.

In some embodiments, the etching process 1204 may be, for example, a wet etching process, a dry etching process, a reactive ion etching (RIE) process, some other etching process, or a combination of the foregoing. The etching process 1204 may be an isotropic etching process or an anisotropic etching process. In further embodiments, the etching process 1204 may be an anisotropic etching process (e.g., anisotropic wet etching process that utilizes potassium hydroxide (KOH) as an etchant) that preferentially etches the <100> crystal directions of the substrate 102 at a faster rate than the <111> crystal directions of the substrate 102, thereby forming the first plurality of PDAF diffusion surfaces 115, the second plurality of PDAF diffusion surfaces 117, and the plurality of IS diffusion surfaces 119 along (111) planes of the substrate 102. In yet further embodiments, the third EMR diffuser 146 may be formed by a separate etching process than the first EMR diffuser 142 and the second EMR diffuser 144.

Figure 13:
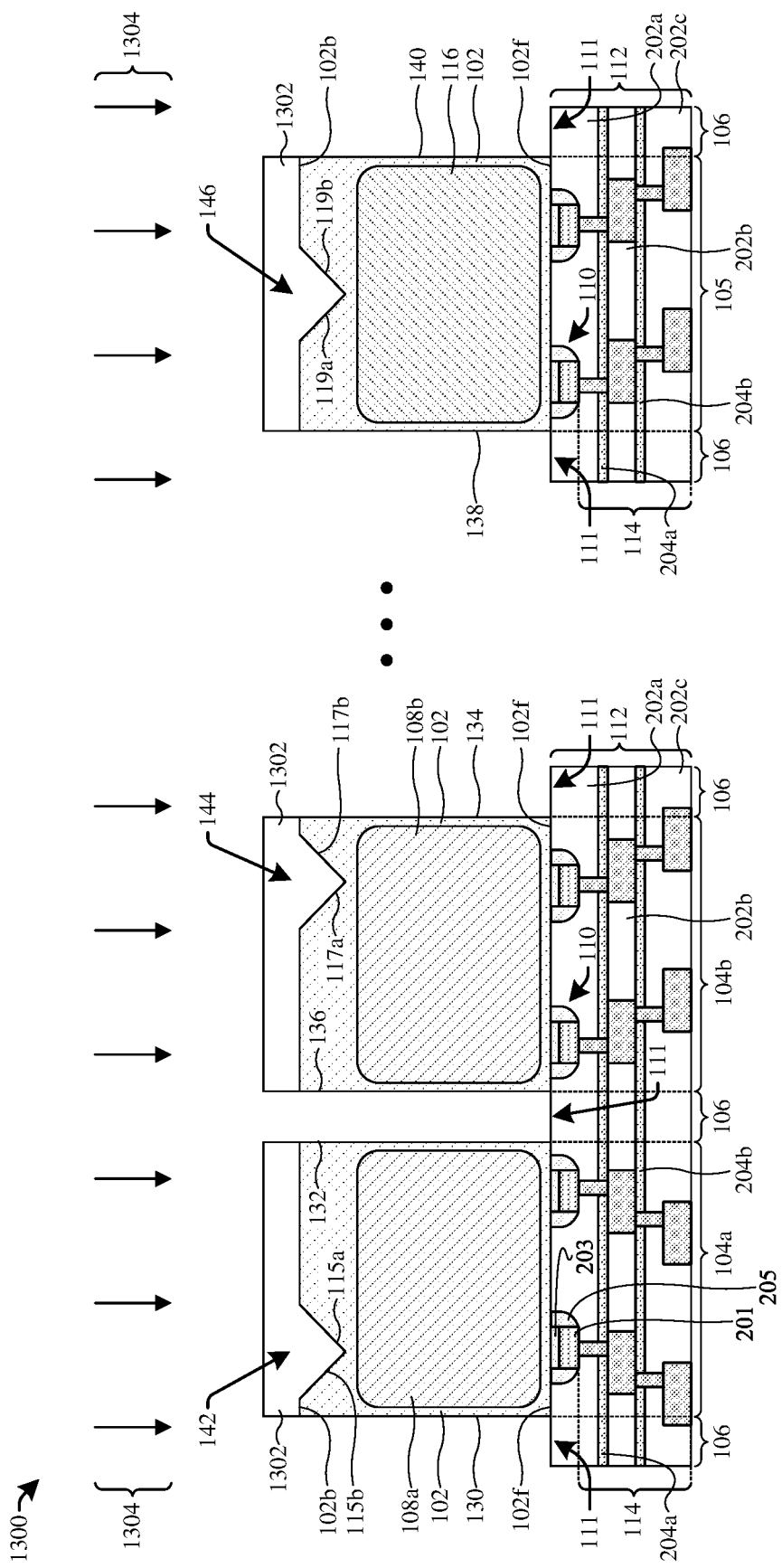

As shown in cross-sectional view 1300 of FIG. 13, one or more isolation trenches 111 are formed in one or more isolation regions 106 that are disposed laterally between the PDAF pixel regions 104 and the IS pixel region 105. The one or more isolation trenches 111 extend into the substrate 102 from the back-side 102b of the substrate 102. In some embodiments, a process for forming the one or more isolation trenches 111 comprises forming a patterned masking layer 1302 over the back-side 102b of the substrate 102 and in the first EMR diffuser 142, the second EMR diffuser 144, and the third EMR diffuser 146. Thereafter, with the patterned masking layer 1302 in place, an etching process 1304 is performed on the substrate 102 to selectively etch the back-side 102b of the substrate 102 according to the patterned masking layer 1302. The etching process 1304 removes unmasked portions of the substrate 102 to form the one or more isolation trenches 111. In some embodiments, the patterned masking layer is subsequently stripped away. In further embodiments, the etching process 1304 may be, for example, a wet etching process, a dry etching process, a RIE process, some other etching process, or a combination of the foregoing.

The one or more isolation trenches 111 are at least partially defined by sidewalls of the substrate 102, which are formed due to the etching process 1304 removing unmasked portions of the substrate 102 to form the one or more isolation trenches 111. In some embodiments, opposite sides of the PDAF pixel regions 104 are defined by these sidewalls of the substrate 102. In further embodiments, opposite sides of the IS pixel region 105 are also defined by these sidewalls of the substrate 102. For example, the first side 130 of the first PDAF pixel region 104a is defined by a first sidewall of the substrate 102, the second side 132 of the first PDAF pixel region 104a is defined by a second sidewall of the substrate 102, the first side 134 of the second PDAF pixel region 104b is defined by a third sidewall of the substrate 102, the second side 136 of the second PDAF pixel region 104b is defined by a fourth sidewall of the substrate 102, the first side 138 of the IS pixel region 105 is defined by a fifth sidewall of the substrate 102, and the second side 140 of the IS pixel region 105 is defined by a sixth sidewall of the substrate 102. The first, second, third, fourth, fifth, and sixth sidewalls of the substrate 102 are laterally spaced.

Figure 14:
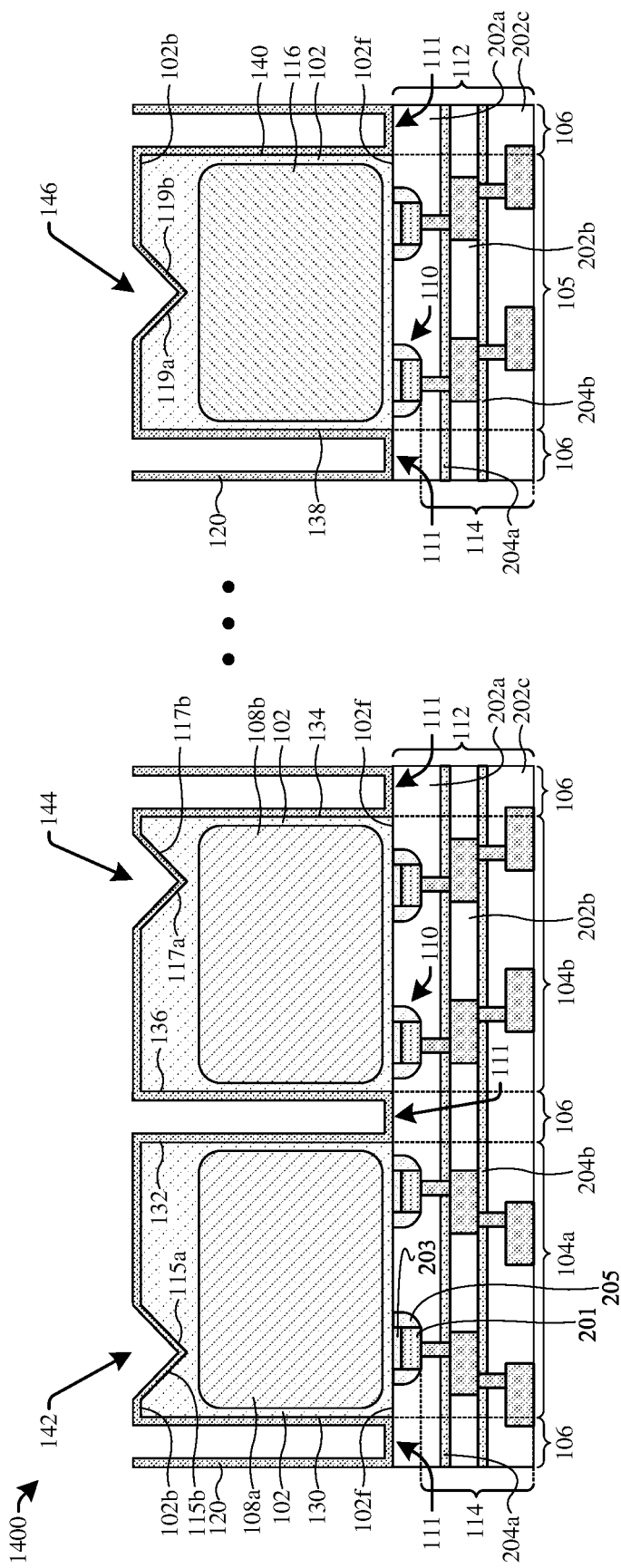

As shown in cross-sectional view 1400 of FIG. 14, an anti-reflective layer 120 is formed along the back-side 102b of the substrate 102. The anti-reflective layer 120 lines the first plurality of PDAF diffusion surfaces 115, the second plurality of PDAF diffusion surfaces 117, and the plurality of IS diffusion surfaces 119. In some embodiments, the anti-reflective layer 120 may also extend to within the one or more isolation trenches 111. In some embodiments, the anti-reflective layer 120 comprises, for example, an oxide (e.g., $SiO_2$), a nitride (e.g., SiN), a carbide (e.g., SiC), a high-k dielectric (e.g., HfO, TaO, etc.), or the like. In some embodiments, the anti-reflective layer 120 may be formed by a deposition technique (e.g., CVD, PVD, ALD, etc.).

Figure 15:
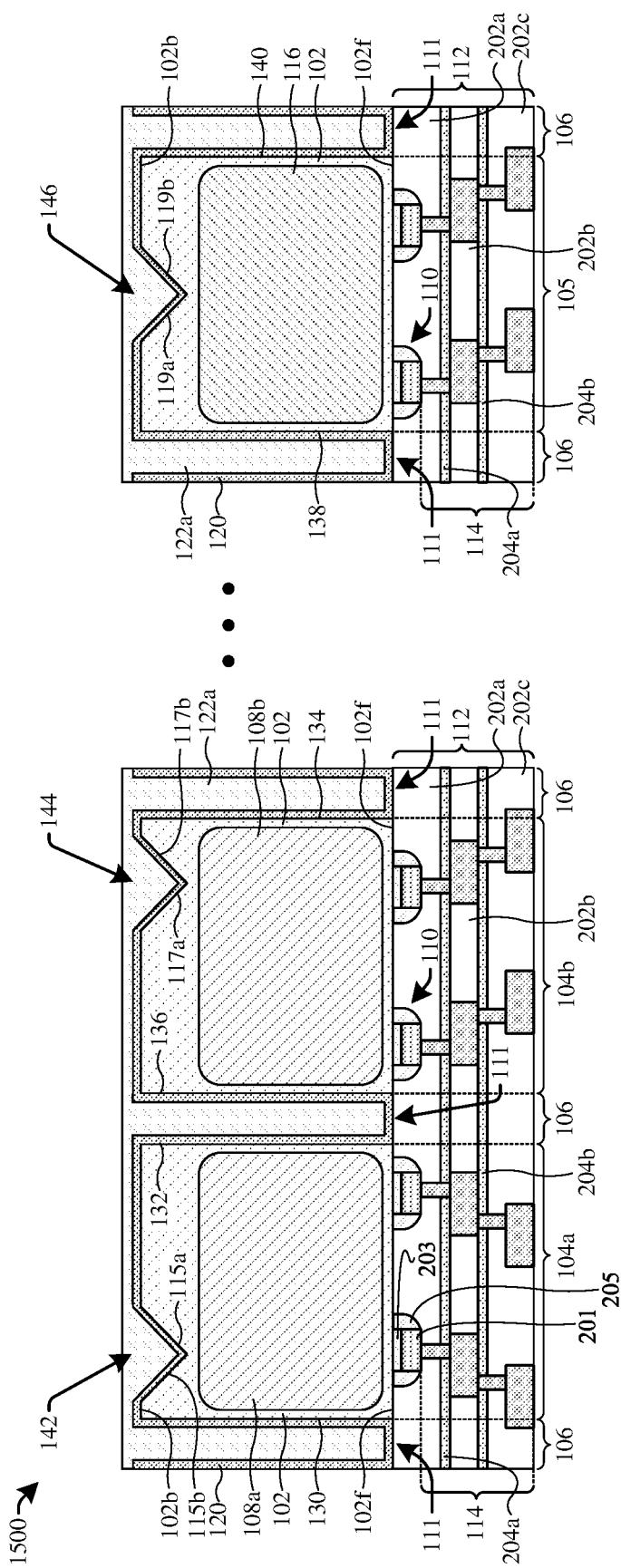

As shown in cross-sectional view 1500 of FIG. 15, a first dielectric layer 122a is formed on the anti-reflective layer 120. The first dielectric layer 122a fills the first EMR diffuser 142, the second EMR diffuser 144, and the third EMR diffuser 146. In some embodiments, the first dielectric layer 122a may further fill the one or more isolation trenches 111. In some embodiments, the first dielectric layer 122a comprises, for example, an oxide (e.g., $SiO_2$), a nitride (e.g., SiN), a carbide (e.g., SiC), a high-k dielectric (HfO, TaO, etc.), or the like. In some embodiments, the first dielectric layer 122a may be formed by a deposition technique (e.g., CVD, PVD, ALD, etc.). In some embodiments, after the first dielectric layer 122a is deposited, a planarization process (e.g., CMP) may be performed on the first dielectric layer 122a to planarize an upper surface of the first dielectric layer 122a.

Figure 16:
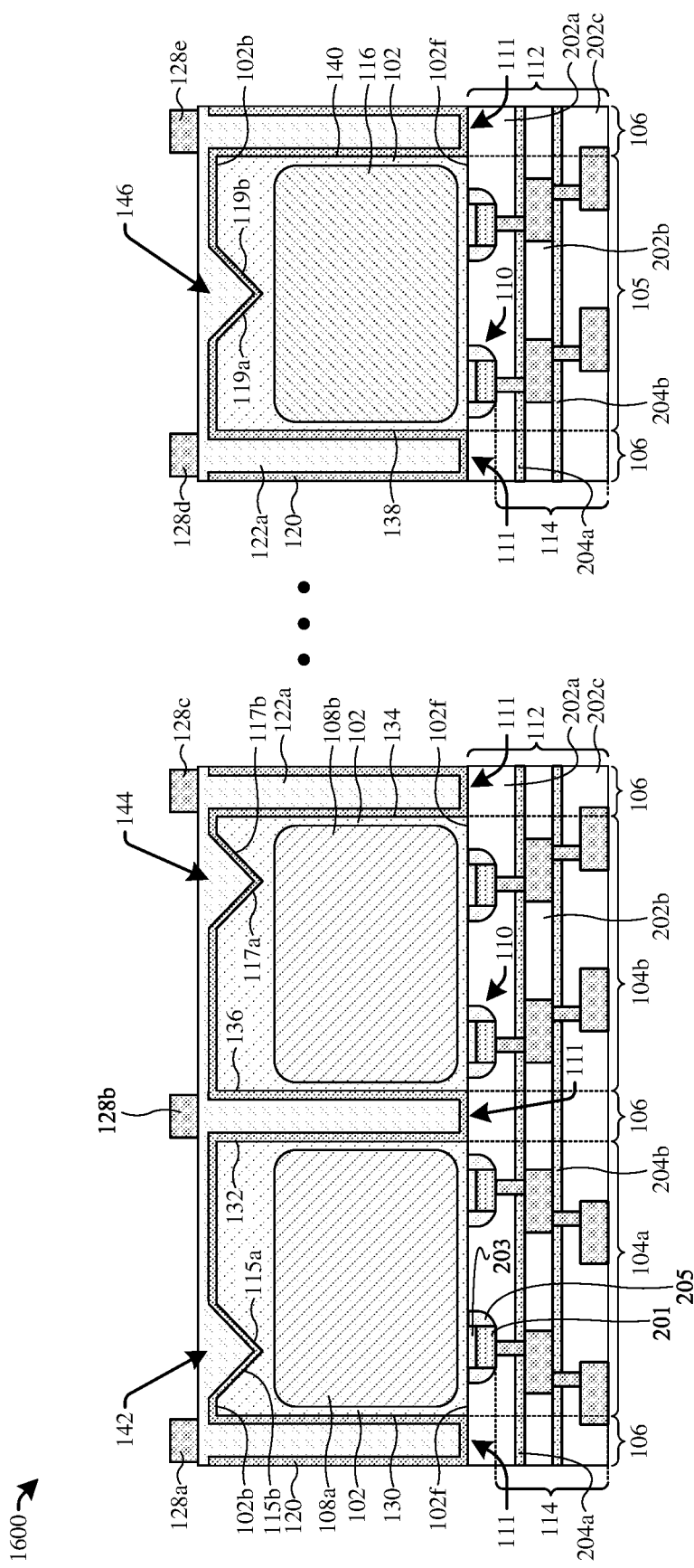

As shown in cross-sectional view 1600 of FIG. 16, a plurality of EMR shields 128 are formed over the first dielectric layer 122a. The EMR shields 128 are disposed outside the PDAF pixel regions 104 and on opposite sides of the PDAF pixel regions 104. In some embodiments, the EMR shields 128 are also disposed outside the IS pixel region 105 and on opposite sides of the IS pixel region 105. The EMR shields 128 may comprise a metal (e.g., aluminum (Al), cobalt (Co), copper (Cu), silver (Ag), gold (Au), tungsten (W), etc.) and/or a dielectric material (e.g., $SiO_2$, SiN, etc.). In some embodiments, the EMR shields 128 may be formed by selectively depositing a metal over the first dielectric layer 122a using a deposition process (e.g., CVD, PVD, ALD, etc.) and/or a plating process (e.g., electrochemical plating, electroless plating, etc.).

Figure 17:
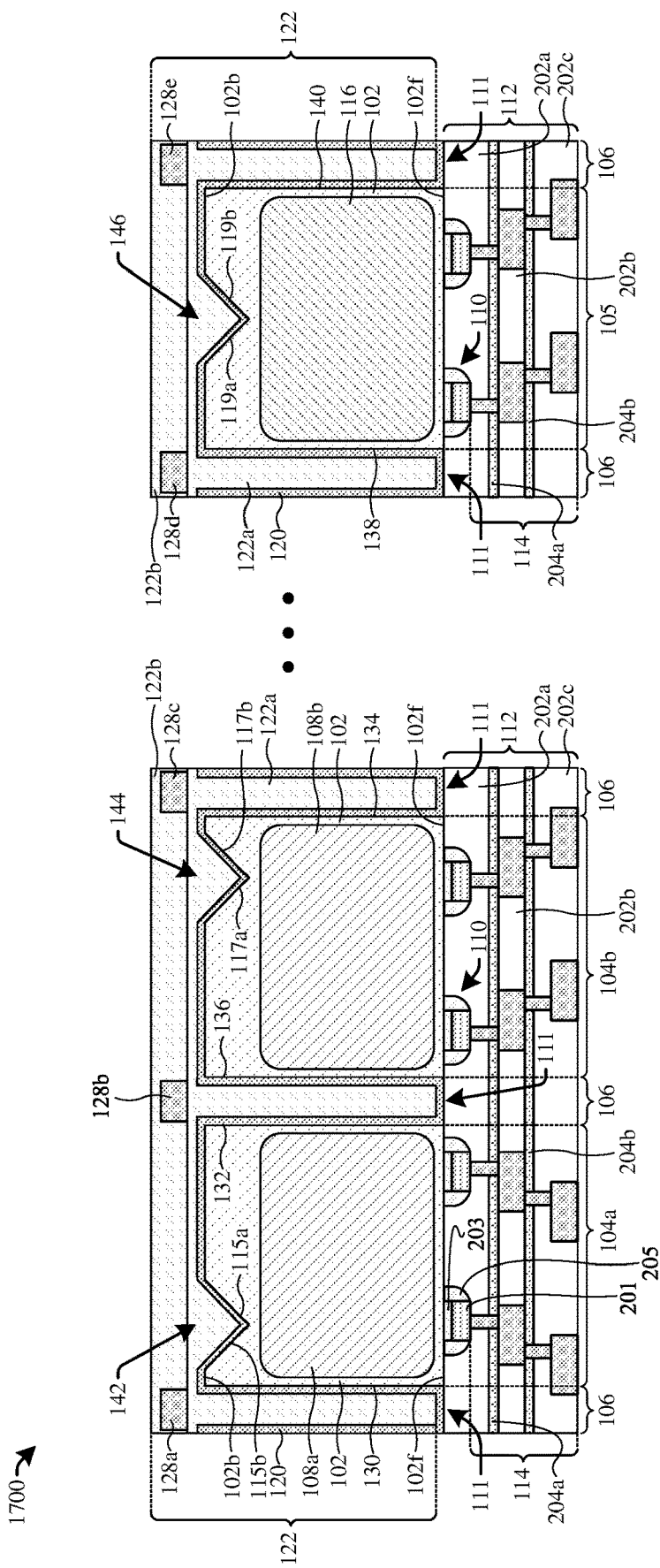

As shown in cross-sectional view 1700 of FIG. 17, a second dielectric layer 122b is formed over the first dielectric layer 122a and the EMR shields 128. In some embodiments, the second dielectric layer 122b comprises, for example, an oxide (e.g., $SiO_2$), a nitride (e.g., SiN), a carbide (e.g., SiC), a high-k dielectric (HfO, TaO, etc.), or the like. In some embodiments, the second dielectric layer 122b may be formed by a deposition technique (e.g., CVD, PVD, ALD, etc.). In some embodiments, after the second dielectric layer 122b is deposited, a planarization process (e.g., CMP) may be performed on the second dielectric layer 122b to planarize an upper surface of the second dielectric layer 122b. In further embodiments, formation of the second dielectric layer 122b completes formation of a second dielectric structure 122.

Figure 18:
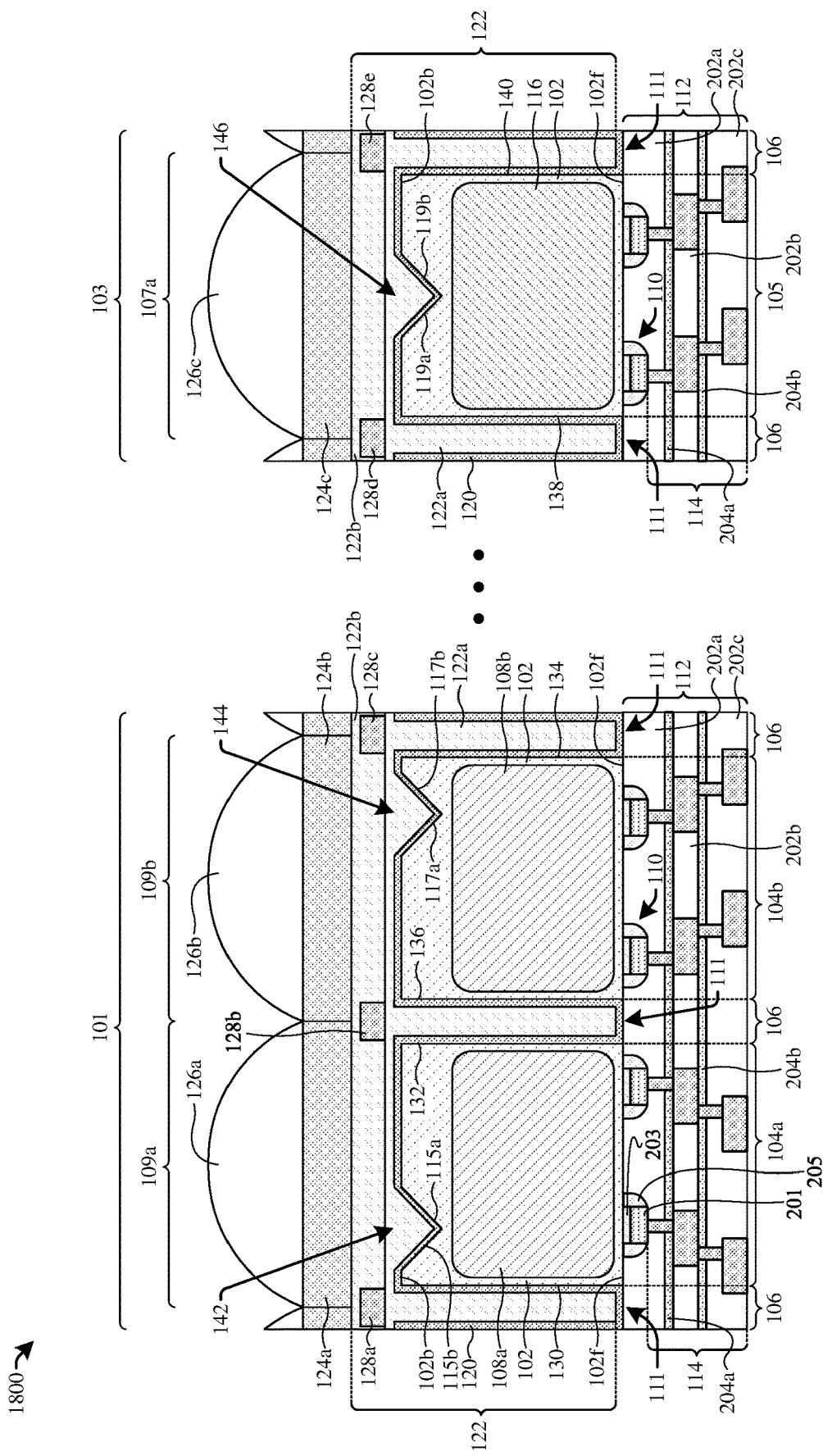

As shown in cross-sectional view 1800 of FIG. 18, a plurality of EMR filters 124 (e.g., color filter array) are formed over the second dielectric structure 122. A plurality of micro-lenses 126 (e.g., a micro-lens array) may be subsequently formed over the EMR filters 124, respectively.

In some embodiments, the EMR filters 124 are formed on the second dielectric layer 122b. In some embodiments, a process for forming the EMR filters 124 comprises depositing (e.g., via CVD, PVD, ALD, sputtering, a spin-on process, etc.) a light filtering material(s) onto the second dielectric layer 122b. The light filtering material(s) is a material that allows for the transmission of radiation (e.g., light) having a specific wavelength range, while blocking light of wavelengths outside of the specified range. Subsequently, in some embodiments, a planarization process (e.g., CMP) may be performed on the EMR filters 124 to planarize the upper surfaces of the EMR filters 124.

In some embodiments, the micro-lenses 126 may be formed by depositing a micro-lens material on the EMR filters 124 (e.g., via CVD, PVD, ALD, sputtering, a spin-on process, etc.). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed, and baked to form a rounding shape. The micro-lenses 126 are then formed by selectively etching the micro-lens material according to the micro-lens template. In some embodiments, after the micro-lenses 126 are formed, formation of the image sensor 100 (see, e.g., FIG. 2) is complete. The image sensor 100 comprises a PDAF region 101 and an IS region 103. A pair of PDAF pixels 109 are disposed in the PDAF region 101, and one or more IS pixels 107 are disposed in the IS region 103.

Figure 19:
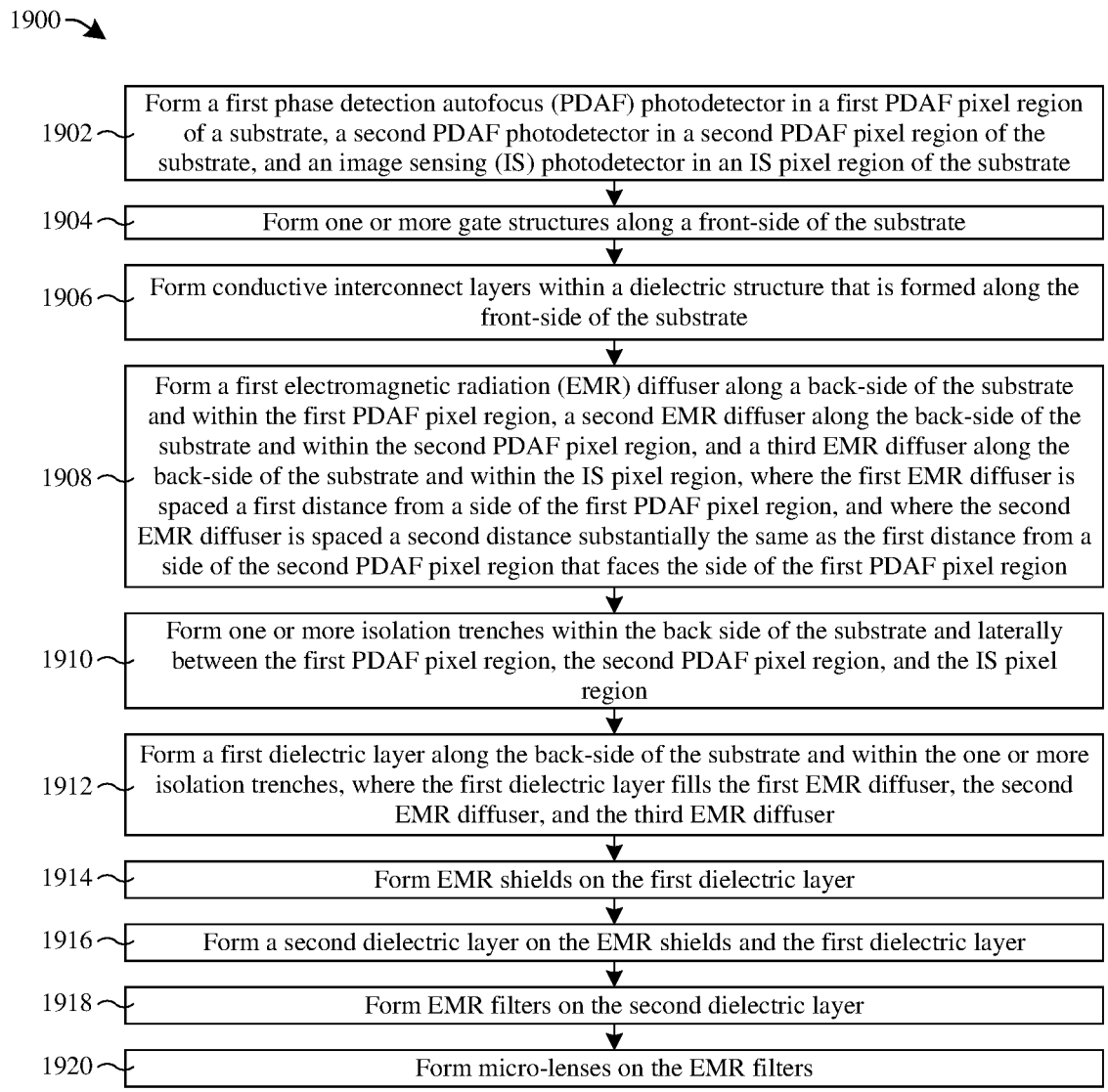
FIG. 19 illustrates a flowchart of some embodiments of a method for forming an image sensor with improved NIR radiation PDAF performance.

FIG. 19 illustrates a flowchart 1900 of some embodiments of a method for forming an image sensor 100 with improved NIR radiation PDAF performance. While the flowchart 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1902, a first phase detection autofocus (PDAF) photodetector is formed in a first PDAF pixel region of a substrate, a second PDAF photodetector is formed in a second PDAF pixel region of the substrate, and an image sensing (IS) photodetector is formed in an IS pixel region of the substrate. FIG. 9 illustrates a cross-sectional view 900 of some embodiments corresponding to act 1902.

At act 1904, one or more gate structures are formed along a front-side of the substrate. FIG. 10 illustrates a cross-sectional view 1000 of some embodiments corresponding to act 1904.

At act 1906, conductive interconnect layers are formed within a dielectric structure that is formed along the front-side of the substrate. FIG. 10 illustrates a cross-sectional view 1000 of some embodiments corresponding to act 1906.

At act 1908, a first electromagnetic radiation (EMR) diffuser is formed along a back-side of the substrate and within the first PDAF pixel region, a second EMR diffuser is formed along the back-side of the substrate and within the second PDAF pixel region, and a third EMR diffuser is formed along the back-side of the substrate and within the IS pixel region, where the first EMR diffuser is spaced a first distance from a side of the first PDAF pixel region, and where the second EMR diffuser is spaced a second distance substantially the same as the first distance from a side of the second PDAF pixel region that faces the side of the first PDAF pixel region. FIGS. 11-12 illustrate a series of cross-sectional views 1100-1200 of some embodiments corresponding to act 1908.

At act 1910, one or more isolation trenches are formed within the back side of the substrate and laterally between the first PDAF pixel region, the second PDAF pixel region, and the IS pixel region. FIG. 13 illustrates a cross-sectional view 1300 of some embodiments corresponding to act 1910.

At act 1912, a first dielectric layer is formed along the back-side of the substrate and within the one or more isolation trenches, where the first dielectric layer fills the first EMR diffuser, the second EMR diffuser, and the third EMR diffuser. FIGS. 14-15 illustrate a series of cross-sectional views 1400-1500 of some embodiments corresponding to act 1912.

At act 1914, EMR shields are formed on the first dielectric layer. FIG. 16 illustrates a cross-sectional view 1600 of some embodiments corresponding to act 1914.

At act 1916, a second dielectric layer is formed on the EMR shields and the first dielectric layer. FIG. 17 illustrates a cross-sectional view 1700 of some embodiments corresponding to act 1916.

At act 1918, EMR filters are formed on the second dielectric layer. FIG. 18 illustrates a cross-sectional view 1800 of some embodiments corresponding to act 1918.

At act 1920, micro-lenses are formed on the EMR filters. FIG. 18 illustrates a cross-sectional view 1800 of some embodiments corresponding to act 1920.

In some embodiments, the present application provides an integrated chip. The integrated chip comprises a pair of phase detection autofocus (PDAF) photodetectors disposed in a semiconductor substrate, wherein the pair of PDAF photodetectors comprises a first PDAF photodetector and a second PDAF photodetector laterally spaced from the first PDAF photodetector, and wherein a first side of the first PDAF photodetector faces a first side of the second PDAF photodetector. A first electromagnetic radiation (EMR) diffuser is disposed along a back-side of the semiconductor substrate and within a perimeter of the first PDAF photodetector, wherein the first EMR diffuser is laterally spaced a first distance from the first side of the first PDAF photodetector, wherein the first EMR diffuser is laterally spaced a second distance less than the first distance from a second side of the first PDAF photodetector, and wherein the second side of the first PDAF photodetector is opposite the first side of the first PDAF photodetector. A second EMR diffuser is disposed along the back-side of the semiconductor substrate and within a perimeter of the second PDAF photodetector, wherein the second EMR diffuser is laterally spaced a third distance from the first side of the second PDAF photodetector, wherein the second EMR diffuser is laterally spaced a fourth distance less than the third distance from a second side of the second PDAF photodetector, and wherein the second side of the second PDAF photodetector is opposite the first side of the second PDAF photodetector.

In some embodiments, the present application provides an integrated chip. The integrated chip comprises a first phase detection autofocus (PDAF) photodetector disposed in a semiconductor substrate. A second PDAF photodetector is disposed in the semiconductor substrate and laterally spaced from the first PDAF photodetector. A first micro-lens is disposed over the semiconductor substrate and the first PDAF photodetector, wherein the first micro-lens is configured to focus incident electromagnetic radiation (EMR) toward the first PDAF photodetector. A second micro-lens is disposed over the semiconductor substrate and the second PDAF photodetector, wherein the second micro-lens is configured to focus incident EMR toward the second PDAF photodetector. An EMR shield is disposed vertically between the semiconductor substrate and the first microlens, wherein the EMR shield is disposed laterally between a first side of the first PDAF photodetector and a first side of the second PDAF photodetector, and wherein the first side of the first PDAF photodetector faces the first side of the second PDAF photodetector. A first EMR diffuser is disposed along a back-side of the semiconductor substrate and between the first side of the first PDAF photodetector and a second side of the first PDAF photodetector opposite the first side of the first PDAF photodetector, and wherein a center point of the first EMR diffuser is disposed nearer the second side of the first PDAF photodetector than the first side of the first PDAF photodetector. A second EMR diffuser is disposed along the back-side of the semiconductor substrate and between the first side of the second PDAF photodetector and a second side of the second PDAF photodetector opposite the first side of the second PDAF photodetector, and wherein a center point of the second EMR diffuser is disposed nearer the second side of the second PDAF photodetector than the first side of the second PDAF photodetector.

In some embodiments, the present application provides a method for forming an integrated chip. The method comprises forming a first phase detection autofocus (PDAF) photodetector in a first PDAF pixel region of a semiconductor substrate. A second PDAF photodetector is formed in a second PDAF pixel region of the semiconductor substrate. A first electromagnetic radiation (EMR) diffuser is formed along a back-side of the semiconductor substrate and within the first PDAF pixel region of the semiconductor substrate. A second EMR diffuser is formed along the back-side of the semiconductor substrate and within the second PDAF pixel region of the semiconductor substrate, wherein a midline of the first PDAF pixel region and a midline of the second PDAF pixel region are both disposed between the first EMR diffuser and the second EMR diffuser. A dielectric layer is formed over the back-side of the semiconductor substrate and filling both the first EMR diffuser and the second EMR diffuser. An EMR shield grid is formed over the dielectric layer and laterally surrounding the first PDAF pixel region and the second PDAF pixel region, wherein the EMR shield grid is disposed outside a perimeter of the first PDAF pixel region and a perimeter of the second PDAF pixel region. A first micro-lens is formed over the EMR shield grid and overlying the first PDAF pixel region. A second micro-lens is formed over the EMR shield grid and overlying the second PDAF pixel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC), comprising:
a pair of phase detection autofocus (PDAF) photodetectors disposed in a semiconductor substrate, wherein the pair of PDAF photodetectors comprises a first PDAF photodetector and a second PDAF photodetector laterally spaced from the first PDAF photodetector, and wherein a first side of the first PDAF photodetector faces a first side of the second PDAF photodetector;
a first electromagnetic radiation (EMR) diffuser disposed along a back-side of the semiconductor substrate and within a perimeter of the first PDAF photodetector, wherein the first EMR diffuser is laterally spaced a first distance from the first side of the first PDAF photodetector, wherein the first EMR diffuser is laterally spaced a second distance less than the first distance from a second side of the first PDAF photodetector, and wherein the second side of the first PDAF photodetector is opposite the first side of the first PDAF photodetector; and
a second EMR diffuser disposed along the back-side of the semiconductor substrate and within a perimeter of the second PDAF photodetector, wherein the second EMR diffuser is laterally spaced a third distance from the first side of the second PDAF photodetector, wherein the second EMR diffuser is laterally spaced a fourth distance less than the third distance from a second side of the second PDAF photodetector, and wherein the second side of the second PDAF photodetector is opposite the first side of the second PDAF photodetector.

2. The IC of claim 1, wherein the first distance and the third distance are substantially the same.

3. The IC of claim 2, wherein the second distance and the fourth distance are substantially the same.

4. The IC of claim 3, wherein:
a height of the first EMR diffuser continuously decreases from a center point of the first EMR diffuser to a perimeter of the first EMR diffuser; and
a height of the second EMR diffuser continuously decreases from a center point of the second EMR diffuser to a perimeter of the second EMR diffuser.

5. The IC of claim 4, further comprising:
a first micro-lens disposed over the back-side of the semiconductor substrate and substantially centered over a first PDAF pixel region of the semiconductor substrate, wherein the first PDAF photodetector is disposed in the first PDAF pixel region of the semiconductor substrate;
a second micro-lens disposed over the back-side of the semiconductor substrate and substantially centered over a second PDAF pixel region of the semiconductor substrate, wherein the second PDAF photodetector is disposed in the second PDAF pixel region of the semiconductor substrate; and
an EMR shield disposed vertically between the first EMR diffuser and the first micro-lens, wherein the EMR shield has a first outer sidewall and a second outer sidewall opposite the first outer sidewall of the EMR shield, and wherein both the first outer sidewall of the EMR shield and the second outer sidewall of the EMR shield are disposed laterally between the first side of the first PDAF photodetector and the first side of the second PDAF photodetector.

6. The IC of claim 1, further comprising:
a dielectric layer disposed over the back-side of the semiconductor substrate and filling both the first EMR diffuser and the second EMR diffuser, wherein the dielectric layer has a lower refractive index than the semiconductor substrate.

7. The IC of claim 6, wherein a height of the first EMR diffuser is substantially the same as a height of the second EMR diffuser.

8. The IC of claim 7, wherein a width of the first EMR diffuser is substantially the same as a width of the second EMR diffuser.

9. The IC of claim 8, wherein a length of the first EMR diffuser is substantially the same as a length of the second EMR diffuser.

10. The IC of claim 9, wherein both the first EMR diffuser and the second EMR diffuser have an inverted pyramid-like shape.

11. The IC of claim 10, wherein:
the height of the first EMR diffuser is between about 0.2 micrometers and about 0.9 micrometers;
the width of the first EMR diffuser is between about 0.1 micrometers and about 1.5 micrometers; and
the length of the first EMR diffuser is between about 0.1 micrometers and about 1.5 micrometers.

12. The IC of claim 9, wherein:
the first EMR diffuser has opposite outer sidewalls that are substantially vertical;
a lower surface of the first EMR diffuser is substantially planar and extends laterally between the opposite outer sidewalls of the first EMR diffuser; and
the second EMR diffuser has opposite outer sidewalls that are substantially vertical; and
a lower surface of the second EMR diffuser is substantially planar and extends laterally between the opposite outer sidewalls of the second EMR diffuser.

13. An integrated chip (IC), comprising:
a first phase detection autofocus (PDAF) photodetector disposed in a semiconductor substrate;
a second PDAF photodetector disposed in the semiconductor substrate and laterally spaced from the first PDAF photodetector;
a first micro-lens disposed over the semiconductor substrate and the first PDAF photodetector, wherein the first micro-lens is configured to focus incident electromagnetic radiation (EMR) toward the first PDAF photodetector;
a second micro-lens disposed over the semiconductor substrate and the second PDAF photodetector, wherein the second micro-lens is configured to focus incident EMR toward the second PDAF photodetector;
an EMR shield disposed vertically between the semiconductor substrate and the first micro-lens, wherein the EMR shield is disposed laterally between a first side of the first PDAF photodetector and a first side of the second PDAF photodetector, and wherein the first side of the first PDAF photodetector faces the first side of the second PDAF photodetector;
a first EMR diffuser disposed along a back-side of the semiconductor substrate and between the first side of the first PDAF photodetector and a second side of the first PDAF photodetector opposite the first side of the first PDAF photodetector, and wherein a center point of the first EMR diffuser is disposed nearer the second side of the first PDAF photodetector than the first side of the first PDAF photodetector; and
a second EMR diffuser disposed along the back-side of the semiconductor substrate and between the first side of the second PDAF photodetector and a second side of the second PDAF photodetector opposite the first side of the second PDAF photodetector, and wherein a center point of the second EMR diffuser is disposed nearer the second side of the second PDAF photodetector than the first side of the second PDAF photodetector.

14. The IC of claim 13, further comprising:
a dielectric layer disposed over the back-side of the semiconductor substrate and filling both the first EMR diffuser and the second EMR diffuser, wherein the dielectric layer has a lower refractive index than the semiconductor substrate.

15. The IC of claim 13, wherein:
the center point of the first EMR diffuser is spaced a first distance from the second side of the first PDAF photodetector;
the center point of the second EMR diffuser is spaced a second distance from the second side of the second PDAF photodetector; and
the first distance is substantially the same as the second distance.

16. The IC of claim 15, wherein:
a third side of the first PDAF photodetector is opposite a fourth side of the first PDAF photodetector;
the first side of the first PDAF photodetector and the second side of the first PDAF photodetector are laterally spaced in a first direction;
the third side of the first PDAF photodetector and the fourth side of the first PDAF photodetector are laterally spaced in a second direction perpendicular to the first direction;
the center point of the first EMR diffuser is spaced a third distance from the third side of the first PDAF photodetector;
a third side of the second PDAF photodetector is opposite a fourth side of the second PDAF photodetector;
the first side of the second PDAF photodetector and the second side of the second PDAF photodetector are laterally spaced in the first direction;
the third side of the second PDAF photodetector and the fourth side of the second PDAF photodetector are laterally spaced in the second direction;
the center point of the second EMR diffuser is spaced a fourth distance from the third side of the second PDAF photodetector; and
the third distance is substantially the same as the fourth distance.

17. The IC of claim 16, wherein:
the center point of the first EMR diffuser is spaced a fifth distance from the fourth side of the first PDAF photodetector;
the center point of the second EMR diffuser is spaced a sixth distance from the fourth side of the second PDAF photodetector; and
the fifth distance is substantially the same as the sixth distance.

18. The IC of claim 17, wherein:
the center point of the first EMR diffuser is spaced a seventh distance from the first side of the first PDAF photodetector;
the center point of the second EMR diffuser is spaced an eighth distance from the first side of the second PDAF photodetector; and
the seventh distance is substantially the same as the eighth distance.

19. The IC of claim 18, a shape of the first EMR diffuser is substantially the same as a shape of the second EMR diffuser.

20. A method for forming an integrated chip (IC), the method comprising:
- forming a first phase detection autofocus (PDAF) photodetector in a first PDAF pixel region of a semiconductor substrate;
- forming a second PDAF photodetector in a second PDAF pixel region of the semiconductor substrate;
- forming a first electromagnetic radiation (EMR) diffuser along a back-side of the semiconductor substrate and within the first PDAF pixel region of the semiconductor substrate;
- forming a second EMR diffuser along the back-side of the semiconductor substrate and within the second PDAF pixel region of the semiconductor substrate, wherein a midline of the first PDAF pixel region and a midline of the second PDAF pixel region are both disposed between the first EMR diffuser and the second EMR diffuser;
- forming a dielectric layer over the back-side of the semiconductor substrate and filling both the first EMR diffuser and the second EMR diffuser;
- forming an EMR shield grid over the dielectric layer and laterally surrounding the first PDAF pixel region and the second PDAF pixel region, wherein the EMR shield grid is disposed outside a perimeter of the first PDAF pixel region and a perimeter of the second PDAF pixel region;
- forming a first micro-lens over the EMR shield grid and overlying the first PDAF pixel region; and
- forming a second micro-lens over the EMR shield grid and overlying the second PDAF pixel region.

* * * * *